(12) United States Patent
Hirano

(10) Patent No.: US 11,961,555 B2
(45) Date of Patent: Apr. 16, 2024

(54) RESISTIVE MEMORY DEVICE WITH BOUNDARY AND EDGE TRANSISTORS COUPLED TO EDGE BIT LINES

(71) Applicant: SAMSUNG ELECTRONICS CO., LTD., Suwon-si (KR)

(72) Inventor: Makoto Hirano, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/827,851

(22) Filed: May 30, 2022

(65) Prior Publication Data

US 2022/0293172 A1 Sep. 15, 2022

Related U.S. Application Data

(62) Division of application No. 17/014,480, filed on Sep. 8, 2020, now Pat. No. 11,380,392.

(30) Foreign Application Priority Data

Dec. 6, 2019 (KR) .................. 10-2019-0161668

(51) Int. Cl.
*G11C 13/00* (2006.01)

(52) U.S. Cl.
CPC ...... *G11C 13/0026* (2013.01); *G11C 13/0007* (2013.01); *G11C 13/0014* (2013.01); *G11C 13/0028* (2013.01); *G11C 2213/79* (2013.01)

(58) Field of Classification Search
None
See application file for complete search history.

(56) References Cited

U.S. PATENT DOCUMENTS

| | | | | |
|---|---|---|---|---|
| 5,894,437 | A * | 4/1999 | Chang et al. | G11C 16/08 365/185.11 |
| 6,859,410 | B2 * | 2/2005 | Scheuerlein | G11C 5/025 365/230.06 |
| 6,876,596 | B1 | 4/2005 | Kirihara | |
| 7,046,559 | B2 * | 5/2006 | Saito | G11C 16/08 365/185.29 |
| 7,304,894 | B2 | 12/2007 | Joo | |
| 7,428,166 | B2 | 9/2008 | Joo | |
| 7,652,931 | B2 | 1/2010 | Park et al. | |
| 8,942,043 | B2 | 1/2015 | Yuan et al. | |
| 9,437,815 | B1 | 9/2016 | Kwan | |
| 9,496,038 | B1 | 11/2016 | Kwak et al. | |
| 9,646,688 | B2 | 5/2017 | Scheuerlein | |
| 2008/0025066 | A1 | 1/2008 | Fasoli et al. | |
| 2012/0236676 | A1 * | 9/2012 | Zeng | G11C 16/06 365/163 |

(Continued)

FOREIGN PATENT DOCUMENTS

KR 10-1753767 6/2017

*Primary Examiner* — J. H. Hur
(74) *Attorney, Agent, or Firm* — Fish & Richardson P.C.

(57) ABSTRACT

A resistive memory device includes a first bit line group including a first edge bit line, a second bit line group including a second edge bit line, and a first boundary transistor configured to apply a non-selection voltage to the second edge bit line according to a selection of the first edge bit line. The first edge bit line of the first bit line group is disposed closest to the second bit line group, and the second edge bit line of the second bit line group is disposed closest to the first bit line group.

10 Claims, 24 Drawing Sheets

(56) References Cited

U.S. PATENT DOCUMENTS

| | | | |
|---|---|---|---|
| 2013/0339571 A1* | 12/2013 | Cernea | G11C 5/025 |
| | | | 711/102 |
| 2016/0049197 A1 | 2/2016 | Park et al. | |
| 2018/0144799 A1 | 5/2018 | Yi et al. | |
| 2018/0374541 A1 | 12/2018 | Jung et al. | |
| 2019/0377632 A1 | 12/2019 | Oh et al. | |

* cited by examiner

US 11,961,555 B2

RESISTIVE MEMORY DEVICE WITH BOUNDARY AND EDGE TRANSISTORS COUPLED TO EDGE BIT LINES

CROSS-REFERENCE TO RELATED APPLICATION

This is a Divisional of U.S. application Ser. No. 17/014,480, filed Sep. 8, 2020, which claims the benefit of Korean Patent Application No. 10-2019-0161668, filed on Dec. 6, 2019, in the Korean Intellectual Property Office, the disclosure of which is incorporated herein in its entirety by reference.

BACKGROUND

The inventive concepts relate to memory devices, and more particularly, to resistive memory devices.

Examples of resistive memory devices include phase change random access memory (RAM) (PRAM), nano floating gate memory (NFGM), polymer RAM (PoRAM), magnetic RAM (MRAM), ferroelectric RAM (FeRAM), and resistive RAM (RRAM). Resistive memory devices advantageously exhibit the high speed characteristics of dynamic RAM (DRAM) and the non-volatile characteristics of flash memory.

The resistance distribution of memory cells of resistive memory devices corresponds to the data programmed therein. To read a memory cell, a given current or voltage may be applied to the memory cell, and a voltage dependent on the magnitude of a resistance of the memory cell may be read, thereby sensing data. However, a sensing margin of the read operation may be negatively impacted by parasitic capacitive components of word lines and bit lines connected to memory cells of resistive memory devices. In addition, the parasitic capacitive components can result in read/write disturbances in which, for example, the program states of memory cells adjacent a read memory cell are altered.

SUMMARY

According to an aspect of the inventive concept, there is provided a resistive memory device including a first bit line group including a first edge bit line, a second bit line group including a second edge bit line, and a first boundary transistor configured to apply a non-selection voltage to the second edge bit line when the first edge bit line is selected. The first edge bit line is disposed closest to the second bit line group among the first bit line group, and the second edge bit line is disposed closest to the first bit line group among the second bit line group.

According to another aspect of the inventive concept, there is provided a resistive memory device including a first bit line group including a first edge bit line, a second bit line group including a second edge bit line, a first edge transistor configured to apply a selection voltage to the first edge bit line according to a first selection signal, a second edge transistor configured to apply the selection voltage to the second edge bit line according to a second selection signal, a third edge transistor configured to apply a non-selection voltage to the first edge bit line according to the first selection signal, and a fourth edge transistor configured to apply the non-selection voltage to the second edge bit line according to the second selection signal.

According to another aspect of the inventive concept, there is provided a resistive memory device is provided including a first word line group including a first edge word line, a second word line group including a second edge word line, a first boundary transistor configured to, when the first edge word line is selected, apply a non-selection voltage to the second edge word line, and a second boundary transistor configured to, when the second edge word line is selected, apply the non-selection voltage to the first edge word line. The first edge word line is disposed closest to the second word line group among the first word line group, and the second edge word line is disposed closest to the first word line group among the second word line group.

According to another aspect of the inventive concept, there is provided an operating method of a resistive memory device including a first bit line group defined by a decoder structure. The method includes applying a non-selection voltage to a first edge bit line disposed at an outermost position among the first bit line group, and floating a first middle bit line included in the first bit line group.

According to another aspect of the inventive concept, there is provided a resistive memory device including a first bit line group including a plurality of bit lines, a first edge bit line disposed at an outermost position in the first bit line group, and a first middle bit line included in the first bit line group, the first middle bit line being adjacent to the first edge bit line. A number of transistors connected to the first edge bit line differs from a number of transistors connected to the first middle bit line.

According to another aspect of the inventive concept, there is provided a resistive memory device including a first bit line group including a plurality of bit lines, a first edge bit line disposed at an outermost position in the first bit line group, and a first middle bit line included in the first bit line group, the first middle bit line being adjacent to a first edge bit line. At least some of a plurality of nodes connected to the first edge bit line through a transistor different from at least some of a plurality of nodes connected to the first middle bit line through a transistor.

BRIEF DESCRIPTION OF THE DRAWINGS

Embodiments of the inventive concepts will be more clearly understood from the detailed description that follows taken in conjunction with the accompanying drawings in which.

DETAILED DESCRIPTION OF THE EMBODIMENTS

Hereinafter, embodiments will be described in detail with reference to the accompanying drawings.

Figure 1:
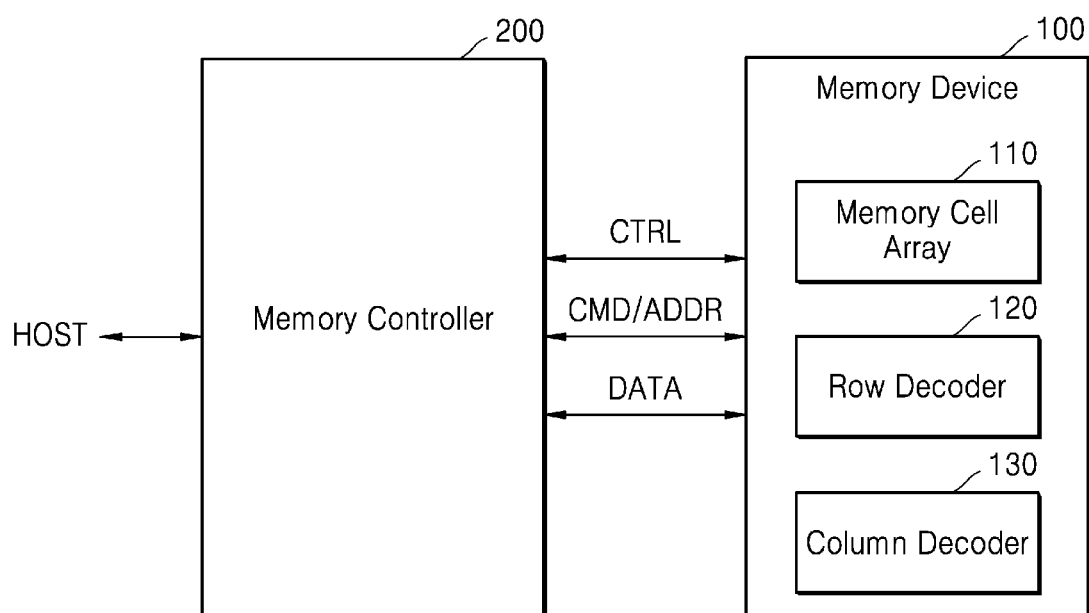
FIG. 1 is a block diagram illustrating a memory system according to an embodiment.

FIG. 1 is a block diagram illustrating a memory system 10 according to an embodiment. As shown, the memory system 10 of the embodiment includes a memory device 100 and a memory controller 200.

The memory controller 200 may include a processor (not shown) which controls the memory controller 200 to execute a variety of memory operations on the memory device 100. A corresponding control platform may be implemented in software, hardware or a combination thereof. For example, in response to a write/read request from a host HOST, the memory controller 200 may control the memory device 100 to read data stored in the memory device 100, or to write data in the memory device 100. To carry out these operations, the memory controller 200 may provide an address ADDR, a command CMD, and a control signal CTRL to the memory device 100 to control a program (write) operation, a read operation, and an erase operation each performed on the memory device 100. Also, data DATA to be written and read data DATA may be transmitted and received between the memory controller 200 and the memory device 100.

The memory controller 200 may include other components not shown in FIG. 1. For example, the memory controller 200 may further include random access memory (RAM) used as a working memory of the processor. As other example, the memory controller 200 may include a host interface operating according to a preestablished host interface protocol. Examples of host interface protocols universal serial bus (USB), multimedia card (MMC), peripheral component interconnection (PCI) express (PIC-E), advanced technology attachment (ATA), serial-ATA, parallel-ATA, small computer system interface (SCSI), enhanced small disk interface (ESDI), and integrated drive electronics (IDE).

The memory controller 200 and the memory device 100 may be implemented as separate semiconductor devices. Alternatively, the memory controller 200 and the memory device 100 may be integrated into one semiconductor device. For example, the memory controller 200 and the memory device 100 may be integrated into one semiconductor device and may be configured as a memory card. That is, the memory controller 200 and the memory device 100 may be integrated into one semiconductor device and may be configured as a personal computer (PC) card (for example, PCMCIA), a compact flash (CF) card, a smart media card (for example, SM/SMC), a memory stick, a multimedia card (for example, MMC, RS-MMC, or microMMC), a secure digital (SD) card (for example, SD, miniSD, or microSD), a universal flash storage (UFS).

As shown in FIG. 1, the memory device 100 may include a memory cell array 110, a row decoder 120, and a column decoder 130. The memory cell array 110 may include a plurality of resistive memory cells, and thus, the memory device 100 may be referred to as a resistive memory device. Hereinafter, for convenience, a resistive memory cell may be referred to simply as a memory cell.

The memory device 100 may be implemented by one or multiple chips, and in a variety of module and/or package types. For example, the memory device 100 may be a device implemented as one memory chip. Alternatively, the memory device 100 may be defined as a device including a plurality of memory chips, and for example, the memory device 100 may be a memory module equipped with a plurality of memory chips. As another example, the memory device 100 may be implemented as in a semiconductor package including one or more memory dies. However, embodiments are not limited to any particular implementation.

The memory cell array 110 may include a plurality of memory cells respectively disposed in a plurality of areas defined by intersections of a plurality of first signal lines and a plurality of second signal lines. Therefore, the memory device 100 may be referred to as a cross-point memory. Hereinafter, a memory cell, on which a write operation is to be performed, among the plurality of memory cells may be referred to as "a selected memory cell".

Each of the aforementioned first signal lines may be one of a bit line and a word line, and each of the aforementioned second signal lines may be the other of the bit line and the word line. Also, each of the plurality of memory cells may be a single level cell (SLC) which stores one bit, or may be a multi-level cell (MLC) which stores data of 2 or more bits. Also, the memory cells may have a plurality of resistance distributions depending on the number of bits stored in each of the memory cells. For example, in a case where 1-bit data is written in each memory cell, the memory cells may have any one of two resistance distributions. In case where 2-bit data is written in each memory cell, the memory cells may have any one of four resistance distributions.

The memory cell array 110 may include a plurality of resistive memory cells including a variable resistor (not shown). For example, the variable resistor may include a phase change material having a resistance that varies based on a temperature, the resistive memory device may be phase-change RAM (PRAM). As another example, in a case where the variable resistor includes an upper electrode, a lower electrode, and complex metal oxide therebetween, the resistive memory device may be a resistive RAM (RRAM). As another example, in a case where the variable resistor includes an upper electrode of a magnetic material, a lower electrode of the magnetic material, and a dielectric material therebetween, the resistive memory device may be a magnetic RAM (MRAM).

The row decoder 120 may be connected to the memory cell array 110 through a plurality of word lines, and in response to a row address generated by decoding the address ADDR, the row decoder 120 may activate a selected word line among the plurality of word lines. Herein, the phrase "a selected word line" may denote a word line connected to a selected memory cell among the plurality of word lines.

In response to the row address, the row decoder 120 may control a voltage applied to a selected word line among the plurality of word lines, or may control a connection relationship of the selected word line. The row decoder 120 may include a plurality of transistors, and at least one transistor may be connected to each of the plurality of word lines. The selected word line may be activated for a write/read operation according to a turn-on or turn-off operation of each of the plurality of transistors.

The column decoder 130 may be connected to the memory cell array 110 through a plurality of bit lines, and in response to a column address generated by decoding the address ADDR, the column decoder 130 may activate a selected bit line of the plurality of bit lines. Herein, the phrase "a selected bit line" may denote a bit line connected to a selected memory cell among the plurality of bit lines.

In response to the column address, the column decoder 130 may control a voltage applied to a selected bit line among the plurality of bit lines, or may control a connection relationship of the selected bit line. The column decoder 130 may include a plurality of transistors, and at least one transistor may be connected to each of the plurality of word lines. The selected bit line may be activated for a write/read operation according to a turn-on or turn-off operation of each of the plurality of transistors.

According to an embodiment, as will be explained in more detail herein below, the row decoder 120 may apply a non-selection voltage so that an edge word line disposed near the selected word line is not floated, and the column decoder 130 may apply a non-selection voltage so that an edge bit line disposed near the selected bit line is not floated. The memory device 100 according to an embodiment may cause the edge word line or the edge bit line not to be floated, and thus, may remove a coupling capacitance between the selected word line and the edge word line or the selected bit line and the edge bit line, thereby decreasing a disturb phenomenon between adjacent word lines or bit lines. According to an embodiment, a non-selection voltage applied to the edge word line or the edge bit line may vary based on their positions.

Figure 2:
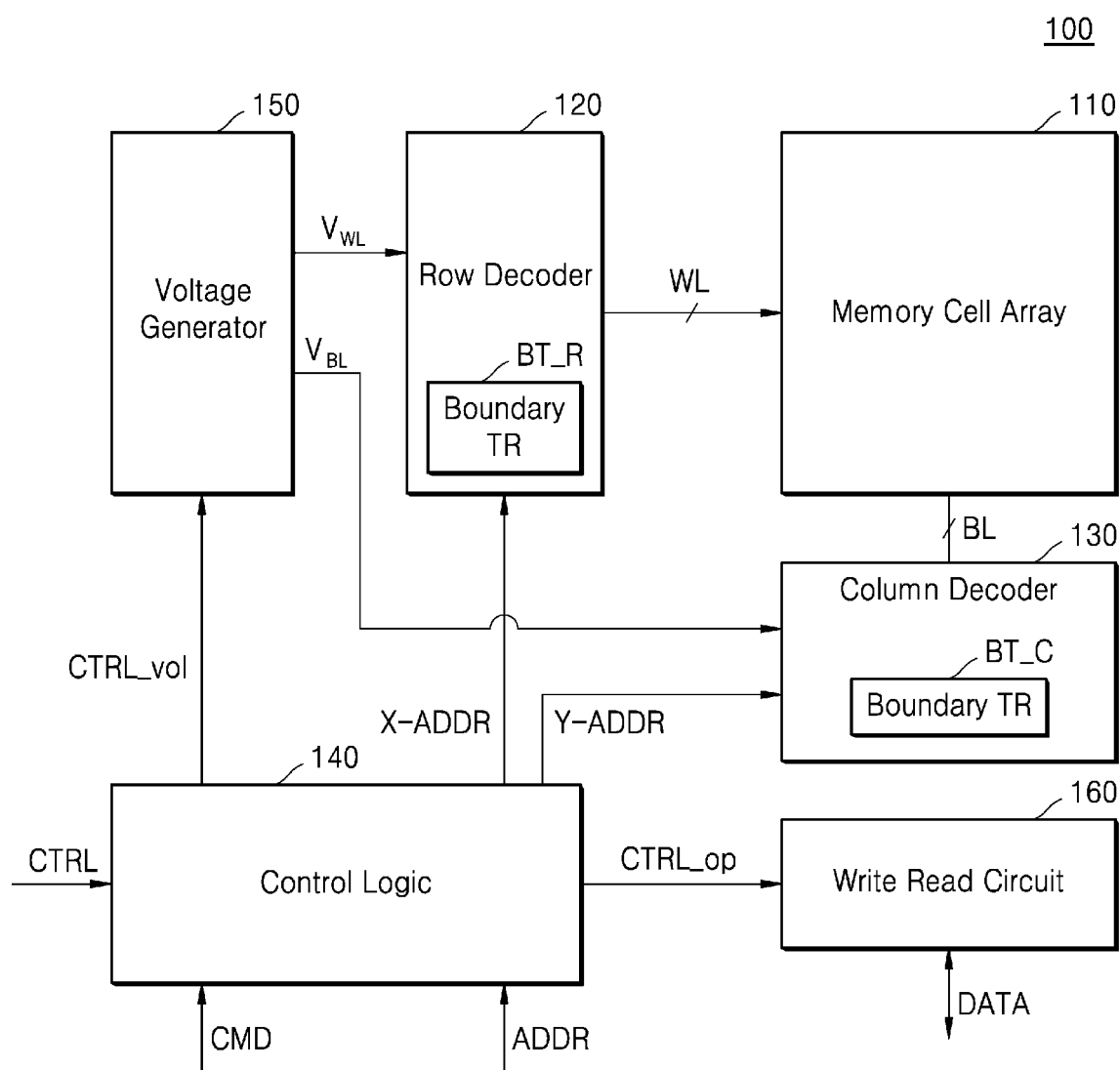
FIG. 2 is a block diagram illustrating a memory device according to an embodiment.

FIG. 2 is a block diagram illustrating a memory device 100 of the memory system 10 of FIG. 1 according to an embodiment.

Referring to FIG. 2, the memory device 100 may include a memory cell array 110, a row decoder 120, a column decoder 130, a voltage generator 150, a control logic 140, and a write/read circuit 160.

The memory cell array 110 may be connected to a plurality of first signal lines and a plurality of second signal lines. Also, the memory cell array 110 may include a plurality of memory cells (not shown) respectively disposed in a plurality of areas defined by intersections of the plurality of first signal lines and the plurality of second signal lines. Hereinafter, an example where the plurality of first signal lines are a plurality of word lines WL and the plurality of second signal lines are a plurality of bit lines BL will be described below.

The control logic 140 may control various elements of the memory device 100, thereby performing a memory operation such as a data write operation and data read operation. For example, the control logic 140 may output various control signals for writing data in the memory cell array 110 or reading data from the memory cell array 110 according to a command CMD, an address ADDR, and a control signal CTRL each received from a memory controller (200 of FIG. 1).

The various control signals output from the control logic 140 may be provided to the write/read circuit 160, the voltage generator 150, the row decoder 120, and the column decoder 130. In detail, the control logic 140 may provide an operation selection signal CTRL_op to the write/read circuit 160 and may provide a voltage control signal CTRL_vol to the voltage generator 150. Also, the control logic 140 may decode the address ADDR to provide a row address X_ADDR to the row decoder 120 and to provide a column address Y_ADDR to the column decoder 130.

In an embodiment, in performing a read operation, the control logic 140 may control a word line selection operation and a bit line selection operation of the row decoder 120 and the column decoder 130 and a sensing operation of the write/read circuit 160, for reading data from a selected memory cell, and may control the voltage generator 150 so that voltages provided to the row decoder 120, the column decoder 130, and the write/read circuit 160 have predetermined voltage levels.

The voltage generator 150 may generate various kinds of voltages for performing a write operation, a read operation, and an erase operation on the memory cell array 110 according to a voltage control signal CTRL_vol. In detail, the voltage generator 150 may generate a plurality of first driving voltages $V_{WL}$ for driving the plurality of word lines WL and a plurality of second driving voltages $V_{BL}$ for driving the plurality of bit lines BL. For example, in performing a read operation, the voltage generator 150 may generate, as the first driving voltages $V_{WL}$, a first precharge voltage, a discharge voltage, and a turn-on or turn-off voltage corresponding to transistors included in the row decoder 120 and may generate, as the second driving voltages $V_{BL}$, a second precharge voltage, a clamping voltage, and a turn-on or turn-off voltage corresponding to transistors of the column decoder 130. Also, the voltage generator 150 may generate various voltages (for example, a set or reset write voltage, a reference voltage, etc.) provided to the write/read circuit 160.

The write/read circuit 160 may be selectively connected to a bit line BL and/or a word line WL and may provide a write current to a selected memory cell to thereby program data DATA, which is to be stored, in the memory cell array 110. Also, the write/read circuit 160 may be selectively connected to a bit line BL and/or a word line WL and may read data written in a selected memory cell. For example, the write/read circuit 160 may detect a voltage from a word line WL connected to a selected memory cell and may amplify the detected voltage to output read data DATA.

The row decoder 120 may include a boundary transistor BT_R. The boundary transistor BT_R included in the row decoder 120 may be connected to an edge word line disposed adjacent to a selected word line WL. Based on a selection voltage being applied to the selected word line WL, the boundary transistor BT_R may bias the edge word line to a non-selection voltage.

The column decoder 130 may include a boundary transistor BT_C. The boundary transistor BT_C included in the column decoder 130 may be connected to an edge bit line disposed adjacent to a selected bit line BL. Based on a selection voltage being applied to the selected bit line BL, the boundary transistor BT_C may bias the edge bit line to a non-selection voltage.

The boundary transistor BT_R included in the row decoder 120 may perform an operation which is substantially the same as or similar to the boundary transistor BT_C included in the column decoder 130. Hereinafter, it may be understood that a description of an operation of the boundary transistor BT_R included in the row decoder 120 may be similarly applied to an operation of the boundary transistor BT_C included in the column decoder 130.

In a read operation performed on the memory cell array 110, a read voltage may be provided to each of a selected word line and a selected bit line, and for example, a first precharge voltage and a second precharge voltage may be respectively applied to the selected word line and the selected bit line so that a voltage differential between the selected word line and the selected bit line corresponds to a set value. Also, after a precharge operation on the selected word line and the selected bit line is completed, a voltage level detected from at least one of the selected word line and the selected bit line may vary based on a program state (for example, a set state or a reset state) of a selected memory cell.

In an embodiment, in a case where an operation of sensing data is performed by using a voltage detected from the selected word line, the voltage level detected from the selected word line may vary based on a program state of the selected memory cell. For example, when a level of the voltage detected from the selected word line is higher than a reference level, data "0" may be sensed based on a set state of the selected memory cell, and when a level of the voltage detected from the selected word line is lower than the reference level, data "1" may be sensed based on a reset state of the selected memory cell. In another embodiment, the memory device 100 may be implemented to sense data by using a voltage detected from the selected bit line. Alternatively, the memory device 100 may be implemented so that data "1" is sensed when the selected memory cell is in the set state and data "0" is sensed when the selected memory cell is in the reset state.

In the read operation, a plurality of word lines and a plurality of bit lines may each have one or more capacitance components (i.e., one or more parasitic capacitors may be present). For example, a plurality of word lines and a plurality of bit lines may have a capacitive component thereof, a capacitive component caused by word lines adjacent thereto, a capacitive component caused by memory cells connected thereto, and a capacitive component caused by peripheral circuits (for example, a driver circuit and a sensing circuit) connected thereto. The capacitive components of each of the word lines and the bit lines may affect a sensing margin and a read/write disturb characteristic.

For example, when a capacitance of a word line and/or a bit line is relatively high, a significant amount of current may flow through a memory cell and a temperature of the memory cell may increase. As a result, read/write disturb may occur. Also, in a read method of sensing data according to a voltage level of a word line or a bit line, when a capacitance of the word line or the bit line is low, a sensing margin may be reduced.

The boundary transistors BT_R and BT_C may apply a non-selection voltage bias to an edge word line and/or an edge bit line disposed adjacent to a selected word line and/or a selected bit line according to a selection voltage being applied to the selected word line and/or the selected bit line. Therefore, read/write disturb occurring in the edge word line and/or the edge bit line may decrease, and a sensing margin of the selected word line and/or the selected bit line may increase.

Figure 3A:
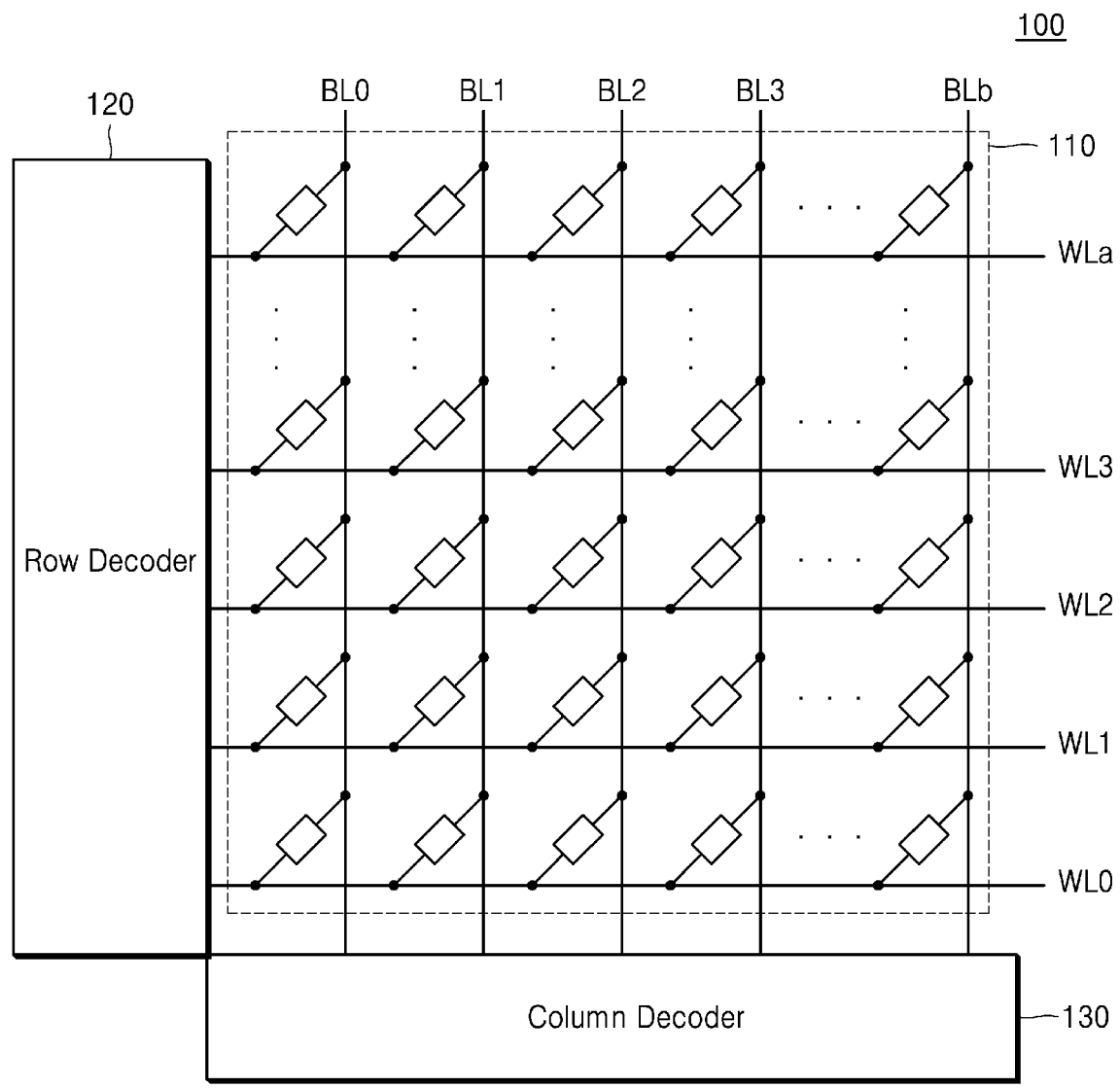
FIG. 3A is a diagram illustrating a portion of a memory device according to an embodiment.
Figure 3B:
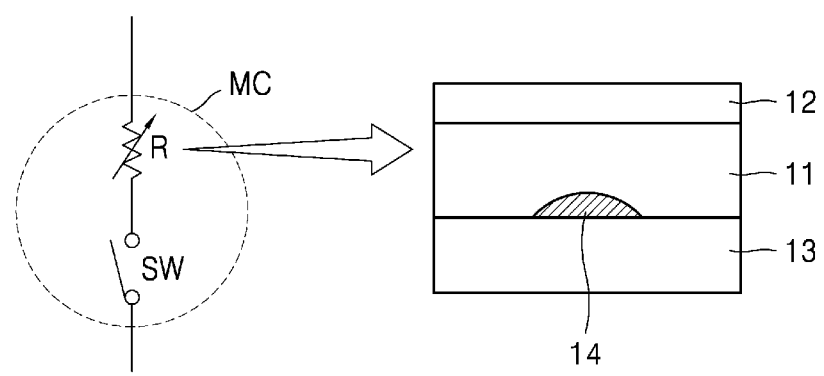
FIG. 3B is a diagram illustrating a memory cell according to an embodiment.

FIG. 3A is a diagram illustrating a portion of a memory device according to an embodiment, and FIG. 3B is a diagram illustrating a memory cell according to an embodiment. In particular, FIGS. 3A and 3B illustrate an example where a resistive memory cell is PRAM memory cell. A memory cell array 110 illustrated in FIG. 3A may correspond to one cell block.

Referring to FIG. 3A, the memory device 100 may include a memory cell array 110, a row decoder 120, and a column decoder 130. The memory cell array 110 may be disposed adjacent to the row decoder 120 in a first direction (for example, an X direction) and may be disposed adjacent to the column decoder 130 in a second direction (for example, a Y direction).

The memory cell array 110 may include a two-dimensional (2D) memory cell array having a horizontal structure and may include a plurality of word lines WL0 to WLa, a plurality of bit lines BL0 to BLb, and a plurality of memory cells MC. The memory cell array 110 may include a plurality of memory blocks. Each of the memory blocks may include a plurality of memory cells arranged in rows and columns. Here, the number of word lines WL, the number of bit lines BL, and the number of memory cells MC may be variously changed according to embodiments. However, the embodiments are not limited to any particular number of word lines WL, bit lines BL and memory cells MC. Further, in some embodiments, the memory cell array 110 may include a three-dimensional (3D) memory cell array.

Referring to FIG. 3B, in an embodiment, each of the plurality of memory cells MC may include a variable resistor R and a switch SW. Here, the variable resistor R may include a variable resistance material, and the switch SW may function as a selector.

In an embodiment, the variable resistor R may be connected between one of the plurality of bit lines BL0 to BLb and the switch SW, and the switch SW may be connected between the variable resistor R and one of the plurality of word lines WL0 to WLa. However, the present disclosure is not limited thereto, and the switch SW may be connected between one of the plurality of bit lines BL0 to BLb and the variable resistor R and the variable resistor R may be connected between the switch SW and one of the plurality of word lines WL0 to WLa.

The switch SW may be connected between one of the plurality of word lines WL0 to WLa and the variable resistor R and may control the supply of a current to the variable resistor R according to a voltage applied to a word line and a bit line each connected thereto. The switch SW may be implemented with an ovonic threshold switching (OTS) material. However, the present embodiment is not limited thereto, and in other embodiments, the switch SW may another be another switchable element such as a unidirectional diode, a bidirectional diode, or a transistor.

A voltage may be applied to the variable resistor R of the memory cell MC through the plurality of word lines WL0 to WLa and the plurality of bit lines BL0 to BLb, and a current may flow in the variable resistor R. For example, the variable resistor R may include a phase change material layer, which is reversibly shifted between a first state and a second state. However, the variable resistor R is not limited thereto and may include an arbitrary variable resistor having a resistance value which varies based on an applied voltage. For example, in a selected memory cell MC, a resistance of the variable resistor R may be reversibly shifted between the first state and the second state according to a voltage applied to the variable resistor R.

Based on a resistance variation of the variable resistor R, the memory cell MC may store digital information "0" or "1" and may erase the digital information from the memory cell MC. For example, data may be written in the memory cell MC in a high resistance state "0" and a low resistance state "1". Here, a write operation performed from the high resistance state "0" to the low resistance state "1" may be referred to as a set operation, and a write operation performed from the low resistance state "1" to the high resistance state "0" may be referred to as a reset operation. However, the memory cell MC according to embodiments is not limited to storing only binary information of a high resistance state "0" and low resistance state "1", and may store resistance states of other type of data such as ternary data.

An arbitrary memory cell MC may be addressed by selecting the plurality of word lines WL0 to WLa and the plurality of bit lines BL0 to BLb, and a certain signal (for example, a voltage or a current) may be applied between the plurality of word lines WL0 to WLa and the plurality of bit lines BL0 to BLb, whereby the memory cell MC may be programmed. In an embodiment, a voltage may be measured through a selected word line among the plurality of word lines WL0 to WLa, and thus, information (i.e., programmed data) based on a resistance value of a variable resistor R of a selected memory cell MC may be read.

As shown in FIG. 3B, the variable resistor R may include a phase change layer 11 as a variable resistor layer including a compound (GST, Ge—Sb—Te) of germanium (Ge), stibium (Sb), and tellurium (Te), an upper electrode 12 provided on the phase change layer 11, and a lower electrode 13 provided under the phase change layer 11.

The upper and lower electrodes 12 and 13 may include any of various metals, metal oxides, and/or metal nitrides. As examples, the upper and lower electrodes 12 and 13 may include one or more of aluminum (Al), copper (Cu), titanium nitride (TiN), titanium aluminum nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chromium (Cr), stibium (Sb), iron (Fe), molybdenum (Mo), palladium (Pd), and the like. Also, the upper and lower electrodes 12 and 13 may include tin (Sn). Further, the upper and lower electrodes 12 and 13 may include at least one of zirconium (Zr), zinc (Zn), $IrO_2$, $StZrO_3$, and the like.

The phase change layer 11 may include a bipolar resistance memory material or a unipolar resistance memory material. The bipolar resistance memory material may be programed in the set state or the reset state according to a polarity of a current and may use Perovskite-based materials. The unipolar resistance memory material may be programed in the set state or the reset state according to a current having the same polarity and may use transition metal oxide such as NiOx or TiOx.

At least a portion 14 of the GST material of the phase change layer 11 may be programmed between an amorphous state having a relatively high resistivity and a crystalline state having a relatively low resistivity. The GST material may be programmed by heating the GST material. A magnitude and duration of heating may be used to determine whether the GST material is programmed in the amorphous state or the crystalline state. A high resistivity and a low resistivity may be respectively designated as programmed values "logic 0" and "logic 1". Conversely, a high resistivity and a low resistivity may be respectively designated as programmed values "logic 1" and "logic 0". In either case, the high or low resistivity may be sensed by measuring a resistivity of the GST material FIGS. 4A to 4C are diagrams illustrating memory cells according to embodiments.

Figure 4A:
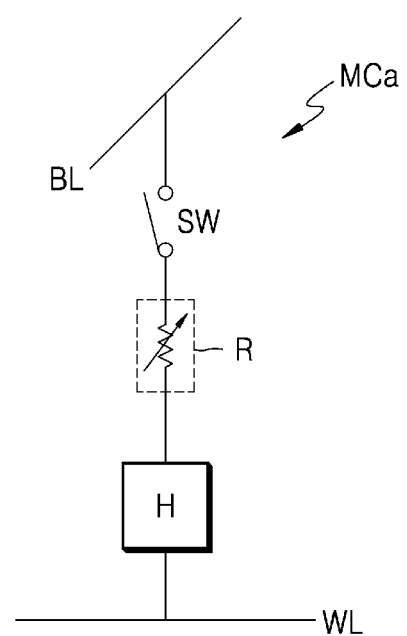
FIGS. 4A to 4C are diagrams illustrating memory cells according to embodiments.
Figure 4B:
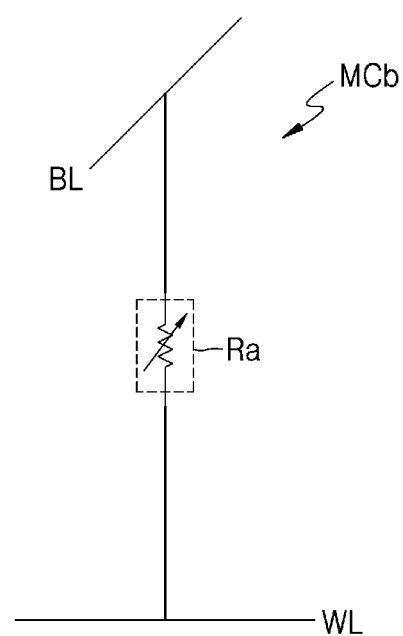
Figure 4C:
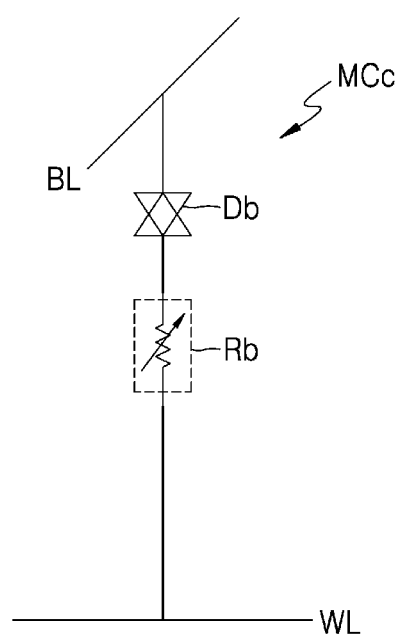

Referring to FIG. 4A, a memory cell MCa according to an embodiment may include a variable resistor R, a switch SW, and a heater H. Here, the variable resistor R may be referred to as a variable resistor or a variable resistance material, and the heater H may be referred to as a heating electrode or a heating electrode layer.

In an embodiment, the variable resistor R may be connected between the switch SW and the heater H, and the switch SW and the heater H may be respectively connected to a bit line BL and a word line WL. In other words, one end of the switch SW may be connected to the bit line BL, and the other end thereof may be connected to the variable resistor R. Also, one end of the heater H may be connected to the word line WL, and the other end thereof may be connected to the variable resistor R.

The variable resistor R may vary to one of a plurality of resistance states according to an electrical pulse (for example, a program current) applied thereto. According to an embodiment, the variable resistor R may include a phase change material where a crystalline state thereof is changed based on the amount of current. The phase change material may be various kinds of materials such as GaSb, InSb, InSe, $Sb_2Te_3$, and GeTe produced by mixing two elements, GeSbTe (GST), GaSeTe, InSbTe, $SnSb_2Te_4$, and InSbGe produced by mixing three elements, and AgInSbTe, (GeSn) SbTe, GeSb(SeTe), and $Te_{81}Ge_{15}Sb_2S_2$ produced by mixing four elements.

The phase change material may have an amorphous state having a relatively high resistance and a crystalline state having a relatively low resistance. A phase of the phase change material may be changed by Joule's heat which occurs based on the amount of current. Also, data may be written by using a phase change. For example, a high resistance state or a reset state may be defined as "0" and a low resistance state or a set state may be defined as "1", and thus, data may be stored in the variable resistor R.

In another embodiment, the variable resistor R may include Perovskite compounds, transition metal oxide, magnetic materials, ferromagnetic materials, or antiferromagnetic materials, instead of the phase change material.

The switch SW may control the supply of a current to the variable resistor R according to a current or a voltage applied to the connected word line WL. The switch SW may include an ovonic threshold switch (OTS) including a chalcogenide compound. The OTS may include a material including arsenic (As), germanium (Ge), selenium (Se), tellurium (Te), silicon (Si), bismuth (Bi), sodium (S), and stibium (Sb). Particularly, the OTS may include a six-element material where Se and S are added to a compound including Ge, Si, As, and Te.

The heater H may heat the variable resistor R when a data write operation (for example, a reset/set operation) is being performed. The heater H may include a conductive material which generates heat sufficient to cause a phase change of the variable resistor R without reacting with the variable resistor R. For example, the heater H may include a carbon-based conductive material.

In embodiments, the heater H may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), SiC, SiCN, carbon nitride (CN), TiCN, TaCN, or a refractory metal corresponding to a combination thereof, or nitride thereof.

Referring to FIG. 4B, a memory cell MCb according to an embodiment may include a variable resistor Ra, and the variable resistor Ra may be connected between a bit line BL and a word line WL. The memory cell MCb may store data according to a program current applied through the bit line BL. Also, the data stored in the memory cell MCb may be read based on a read current applied through the word line WL.

Referring to FIG. 4C, a memory cell MCc according to an embodiment may include a variable resistor Rb and a bidirectional diode Db. The variable resistor Rb may include a resistance material for storing data. The bidirectional diode Db may be connected between the variable resistor Rb and the bit line BL, and the variable resistor Rb may be connected between the word line WL and the bidirectional diode Db. A leakage current flowing in an unselected resistance memory cell may be cut off by the bidirectional diode Db.

Figure 5:
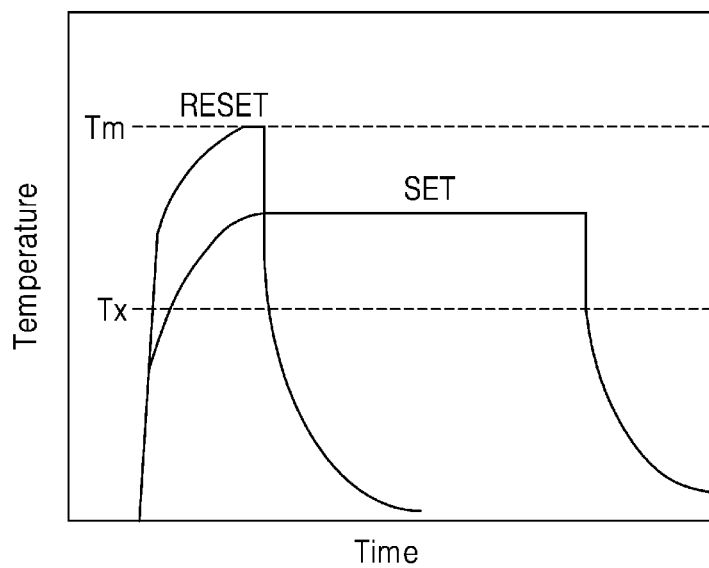
FIG. 5 is a graph for reference in describing a set operation and a reset write operation performed on a variable resistor of a memory cell according to an embodiment.

FIG. 5 is a graph for reference in describing a set operation and a reset write operation performed on a variable resistor of a memory cell according to an embodiment.

Referring to FIG. 5, when a phase change material of a variable resistor (R of FIG. 3B) is heated at a temperature between a crystallization temperature Tx and a melting point Tm for a certain time and then is gradually cooled, the phase change material may be transformed (set) into a crystalline state. The crystalline state may be referred to as a set state and may be a state where data "0" is stored. On the other hand, when the phase change material is heated at a temperature equal to or higher than the melting point Tm for a certain time and then is rapidly cooled, the phase change material may be transformed (reset) to an amorphous state. The amorphous state may be referred to as a reset state and may be a state where data "1" is stored. Data may be stored by supplying a current to the variable resistor R, and data may be read by measuring a resistance value of the variable resistor R.

Figure 6A:
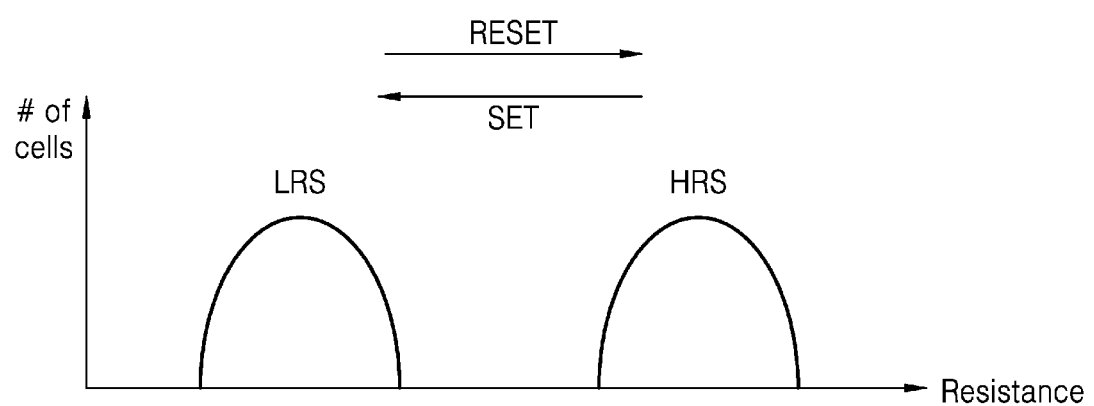
FIG. 6A is a graph showing exemplary resistance distributions of single level memory cells.
Figure 6B:
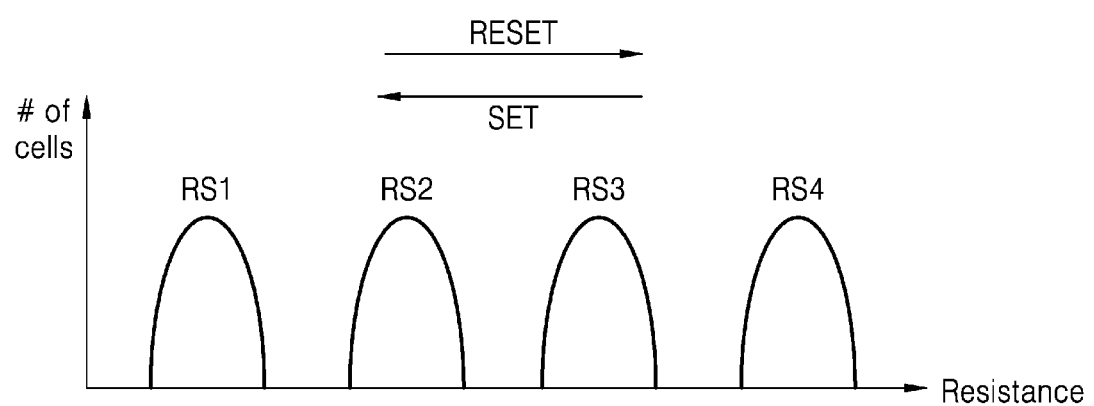
FIG. 6B is a graph showing exemplary resistance distributions of multi-level memory cells.

FIG. 6A is a graph showing exemplary resistance distributions of single level memory cells, and FIG. 6B is a graph showing exemplary resistance distributions of multi-level memory cells.

Referring to FIG. 6A, the abscissa axis represents a resistance, and the ordinate axis represents the number of memory cells MC. For example, when a memory cell MC is a single level cell which is programmed by 1 bit, the memory cell MC may have a low resistance state LRS or a high resistance state HRS.

The low resistance state LRS and the high resistance state HRS may each correspond to one of data "0" and data "1". In an embodiment, a resistance level R may increase in the order of data "0" to data "1" That is, the low resistance state LRS may correspond to data "0", and the high resistance state HRS may correspond to data "1".

An operation of applying a program current to the memory cell MC to change the memory cell MC from the high resistance state HRS to the low resistance state LRS may be referred to as a set operation or a set write operation. Also, an operation of applying a program current to the memory cell MC to change the memory cell MC from the low resistance state LRS to the high resistance state HRS may be referred to as a reset operation or a reset write operation.

Referring to FIG. 6B, the abscissa axis represents a resistance, and the ordinate axis represents the number of memory cells MC. For example, when a memory cell MC is a multi-level cell which is programmed by 2 bits, the memory cell MC may have one of a first resistance state RS1, a second resistance state RS2, a third resistance state RS3, and a fourth resistance state RS4. However, the inventive concept is not limited thereto, and in other embodiments, a plurality of memory cells may include triple level cells (TLCs) storing 3-bit data and thus may each have one of eight resistance states. In other embodiments, a plurality of memory cells may include memory cells storing data of 4 or more bits.

Each of the first to fourth resistance states RS1 to RS4 may correspond to one of data "00", data "01", data "10", and data "11". In an embodiment, the resistance level R may increase in the order of data "11", data "01", data "00", and data "10". That is, the first resistance state RS1 may correspond to data "11", the second resistance state RS2 may correspond to data "01", the third resistance state RS3 may correspond to data "00", and the fourth resistance state RS4 may correspond to data "10".

Figure 7:
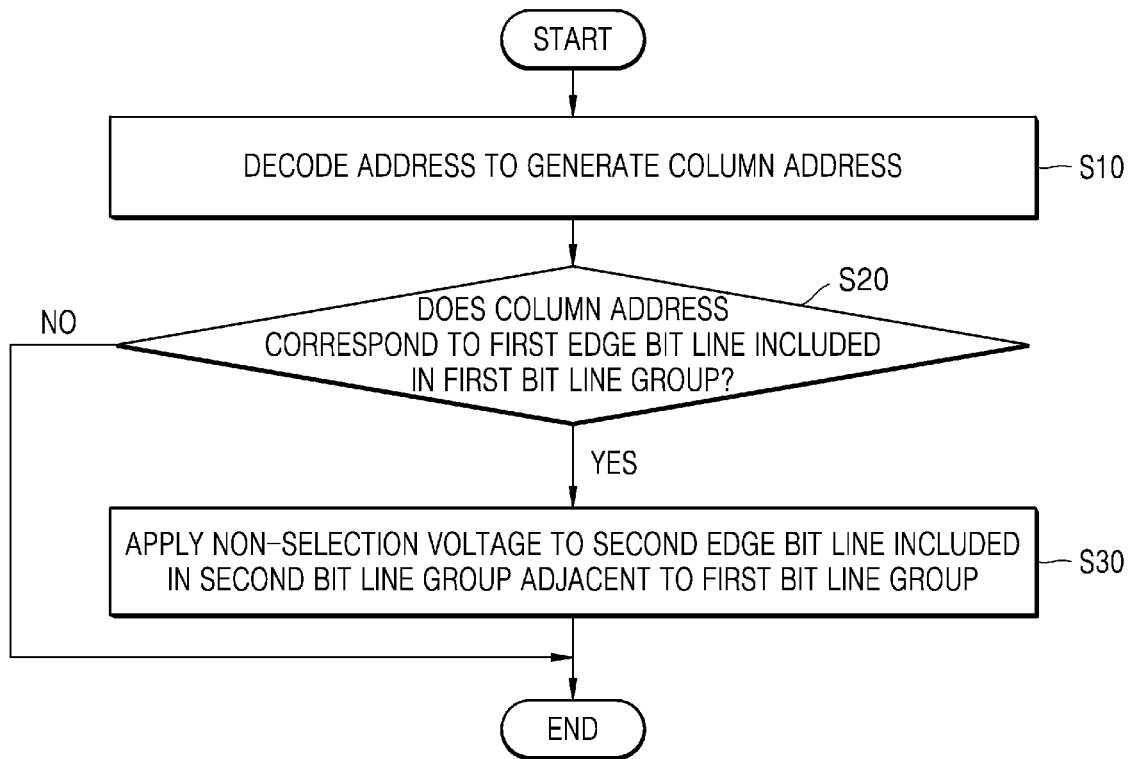
FIG. 7 is a flowchart for reference in describing an operation of a memory device according to an embodiment.

FIG. 7 is a flowchart for reference in describing an operation of a memory device 100 according to an embodiment.

Referring to FIGS. 1 and 7, the memory device 100 may decode an address ADDR of the memory controller 200 to generate a column address (Y_ADDR of FIG. 2) in operation S10. In operation S20, the memory device 100 may determine whether the column address Y_ADDR corresponds to a first edge bit line included in a first bit line group. Herein, a bit line group may denote a plurality of bit lines connected to one local decoder, and an edge bit line may denote a bit line placed at an outermost position in the bit line group. This will be described below in detail with reference to FIG. 8.

When the first edge bit line is selected, the memory device 100 may apply a non-selection voltage to a second edge bit line included in a second bit line group adjacent to the first bit line group in operation S30. Herein, a non-selection voltage may denote a voltage applied to an unselected bit line of a bit line group, and in an embodiment, may be a ground voltage.

Figure 8:
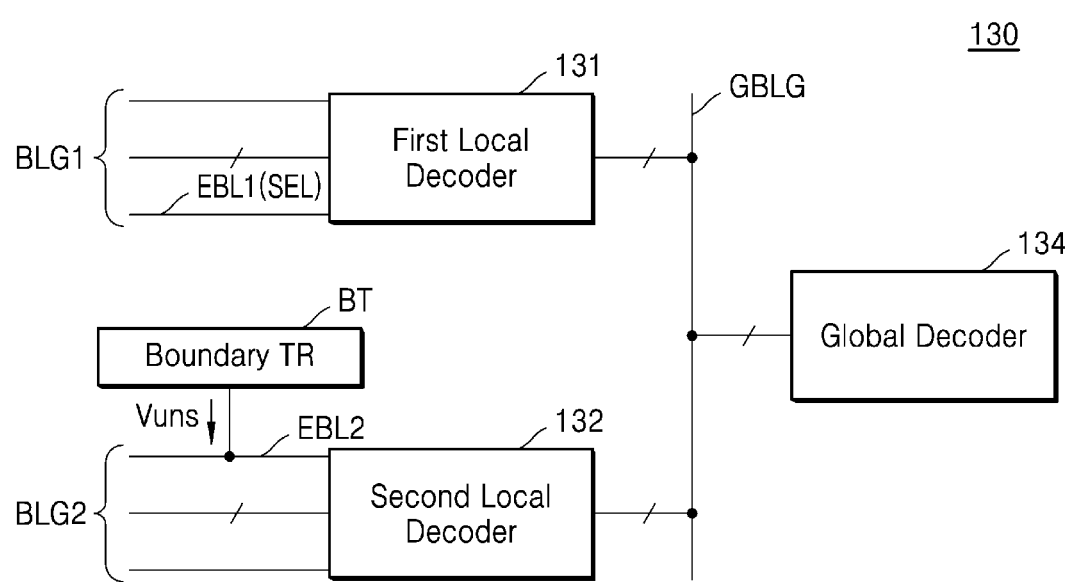
FIG. 8 is a block diagram illustrating a column decoder according to an embodiment.

FIG. 8 is a block diagram illustrating a column decoder 130 according to an embodiment.

Referring to FIG. 8, the column decoder 130 of the embodiment includes a first local decoder 131, a second local decoder 132, a global decoder 134, and a boundary transistor (TR) BT. The first local decoder 131 may be connected to a first bit line group BLG1 including a plurality of bit lines and may activate the plurality of bit lines included in the first bit line group BLG1 according to a column address (Y_ADDR of FIG. 2). The second local decoder 132 may be connected to a second bit line group BLG2 including a plurality of bit lines and may activate the plurality of bit lines included in the second bit line group BLG2 according to a column address (Y_ADDR of FIG. 2).

The global decoder 134 may be connected to a plurality of local decoders (for example, the first and second local decoders 131 and 132) through a global bit line group GBLB, and based on the column address Y_ADDR, the global decoder 134 may apply a selection voltage to a selected bit line corresponding to a plurality of bit lines connected to the first and second local decoders 131 and 132 and may apply a non-selection voltage to the other bit lines.

In an embodiment, the first local decoder 131 may activate the first bit line group BLG1 according to the column address Y_ADDR, and the second local decoder 132 may activate the second bit line group BLG2 according to the column address Y_ADDR. The global decoder 134 may apply a selection voltage to a first edge bit line EBL1 placed at the outermost position in the first bit line group BLG1 according to the column address Y_ADDR and may apply a non-selection voltage to bit lines, except the first edge bit line EBL1, of the plurality of bit lines included in the first bit line group BLG1.

When the first edge bit line EBL1 is selected, the boundary transistor BT may apply a non-selection voltage Vuns to a second edge bit line EBL2 adjacent to the first bit line group BLG1. In an embodiment, the non-selection voltage Vuns may have the same voltage level (for example, a ground voltage) as that of a voltage applied to an unselected bit line of the first bit line group BLG1.

In FIG. 8, an example where the column decoder 130 includes two local decoders (for example, the first and second local decoders 131 and 132) is illustrated, but this is merely an embodiment and it is obvious that the inventive concept may be applied to an embodiment where the column decoder 130 includes three or more local decoders.

Also, in FIG. 8, the boundary transistor BT may apply the non-selection voltage Vuns to the second edge bit line EBL2 according to a selection of the first edge bit line EBL1, but the inventive concept is not limited thereto and it may be understood that embodiments may be applied to all elements which apply the non-selection voltage Vuns to the second edge bit line EBL2 according to a selection of the first edge bit line EBL1.

Figure 9A:
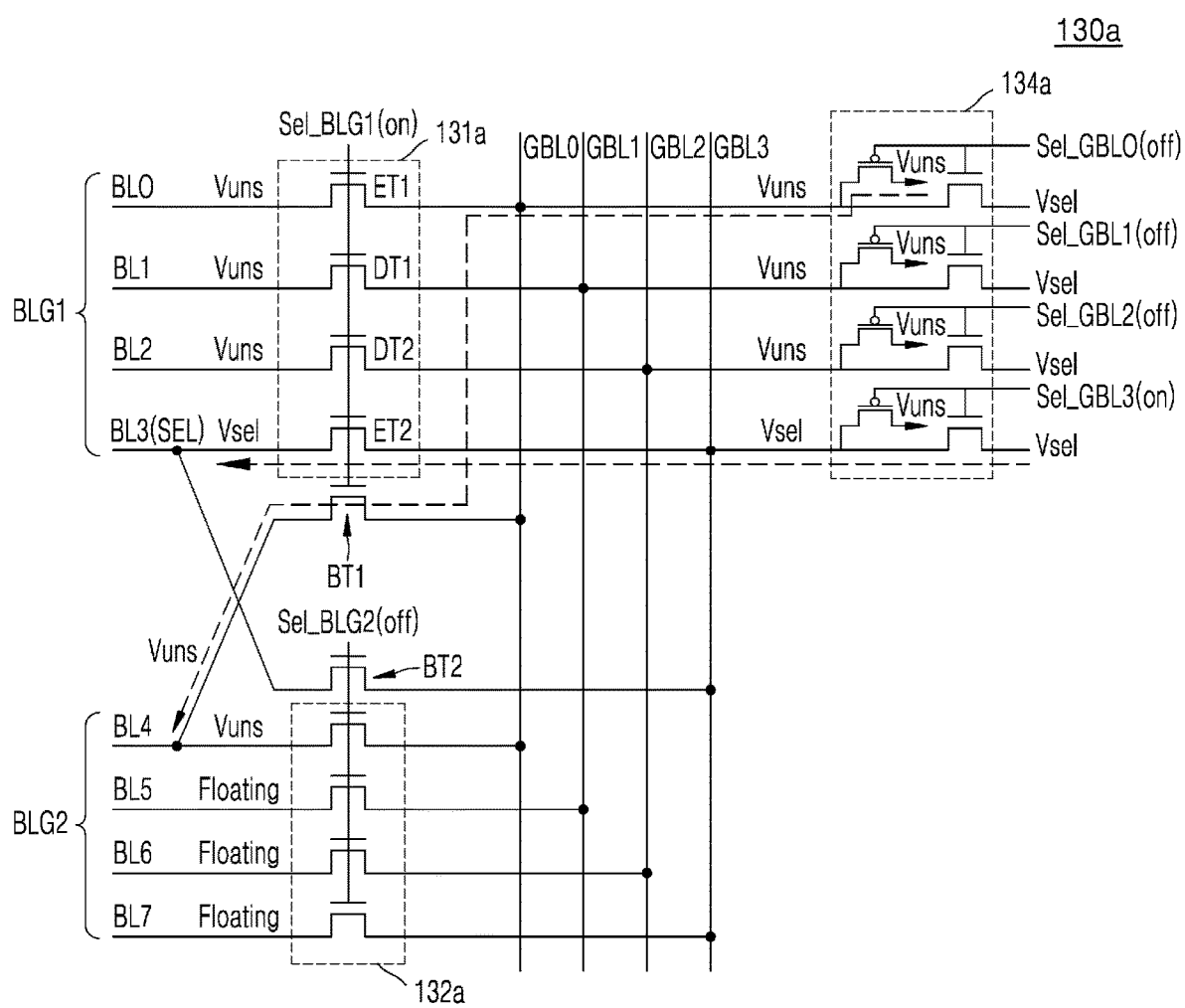
FIGS. 9A and 9B are circuit diagrams illustrating column decoders according to embodiments.
Figure 9B:
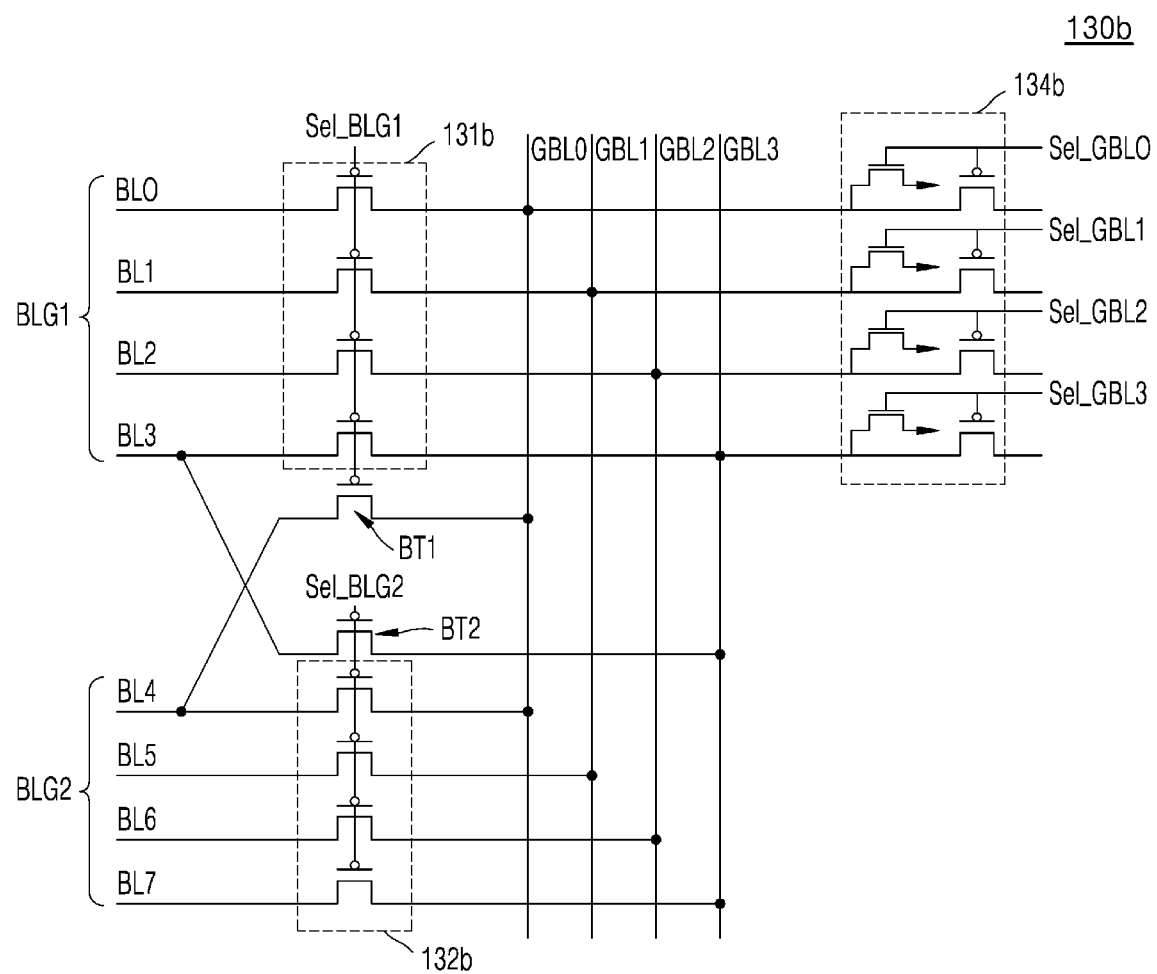

FIGS. 9A and 9B are circuit diagrams illustrating a column decoder according to an embodiment.

Referring to FIG. 9A, a column decoder 130a according to an embodiment may include a first local decoder 131a, a second local decoder 132a, a global decoder 134a, a first boundary transistor BT1, and a second boundary transistor BT2. The first local decoder 131a may include a plurality of transistors ET1, ET2, DT1, and DT2, and the plurality of transistors ET1, ET2, DT1, and DT2 may be respectively connected to first to fourth bit lines BL0 to BL3. The first to fourth bit lines BL0 to BL3 may configure a first bit line group BLG1.

One end of a first edge transistor ET1 and one end of a second edge transistor ET2 may be respectively connected to the first bit line BL0 and the fourth bit line BL3 each disposed at outermost positions in the first bit line group BLG1. The other end of the first edge transistor ET1 and the other end of the second edge transistor ET2 may be respectively connected to a first global bit line GBL0 and a fourth global bit line GBL3. According to an embodiment, the other end of the first edge transistor ET1 and the other end of the second edge transistor ET2 may be connected to unselected power sources such as a ground node and a supply power node, instead of global bit lines.

Also, one end of a first decoding transistor DT1 and one end of a second decoding transistor DT2 may be respectively connected to the second bit line BL1 and the third bit line BL2. The other end of the first decoding transistor DT1 and the other end of the second decoding transistor DT2 may be connected to a second global bit line GBL1 and a third global bit line GBL2.

Herein, like the first bit line BL0 and the fourth bit line BL3, a bit line placed at an outermost position in one bit line group may be referred to as an edge bit line. Also, a transistor connected to an edge bit line and included in the first and second local decoders 131a and 132a may be referred to as an edge transistor, and transistors other than an edge transistor among transistors of the first and second local decoders 131a and 132a may be referred to as decoding transistors (for example, first decoding transistor DT1 and second decoding transistor DT2).

A first bit line group selection signal Sel_BLG1 may be received by the plurality of transistors ET1, ET2, DT1, and DT2 included in the first local decoder 131a. The plurality of transistors ET1, ET2, DT1, and DT2 included in the first local decoder 131a may electrically connect or disconnect the first bit line group BLG1 to or from the first to fourth global bit lines GBL0 to GBL3 according to the first bit line group selection signal Sel_BLG1.

The second local decoder 132a, like the first local decoder 131a, may include a plurality of transistors and may electrically connect or disconnect the second bit line group BLG2 to or from the first to fourth global bit lines GBL0 to GBL3 according to the second bit line group selection signal Sel_BLG2. In an embodiment, the first bit line group selection signal Sel_BLG1 and the second bit line group selection signal Sel_BLG2 may include a column address (Y_ADDR of FIG. 2).

The global decoder 134a may include a plurality of transistors (for example, complimentary metal oxide semiconductor (CMOS) transistors) connected to the first to fourth global bit lines GBL0 to GBL3. The plurality of transistors included in the global decoder 134a may respectively apply a selection voltage Vsel or a non-selection voltage Vuns to the first to fourth global bit lines GBL0 to GBL3 according to a plurality of global bit line selection signals Sel_GBL0 to Sel_GBL3. In an embodiment, the first to fourth global bit lines GBL0 to GBL3 may be included in the column address Y_ADDR.

One end of the first boundary transistor BT1 may be connected to a fifth bit line BL4, disposed closest to the first bit line group BLG1, of the second bit line group BLG2, and the other end thereof may be connected to the first global bit line GBL0. Also, a gate of the first boundary transistor BT1 may receive the first bit line group selection signal Sel_BLG1. The first boundary transistor BT1 may electrically connect or disconnect the fifth bit line BL4 to or from the first global bit line GBL0 according to the first bit line group selection signal Sel_BLG1.

One end of the second boundary transistor BT2 may be connected to a fourth bit line BL3, disposed closest to the second bit line group BLG2, of the first bit line group BLG1, and the other end thereof may be connected to the fourth global bit line GBL3. Also, a gate of the second boundary transistor BT2 may receive the second bit line group selection signal Sel_BLG2. The second boundary transistor BT2 may electrically connect or disconnect the fourth bit line BL3 to or from the fourth global bit line GBL3 according to the second bit line group selection signal Sel_BLG2.

In an embodiment where the fourth bit line BL3 is selected, the first bit line group selection signal Sel_BLG1 may have an on state (for example, a logic high level), and the second bit line group selection signal Sel_BLG2 may have an off state (for example, a logic low level). Therefore, the first local decoder 131a may electrically connect the first bit line group BLG1 to the first to fourth global bit lines GBL0 to GBL3, and the second local decoder 132a may electrically disconnect the second bit line group BLG2 from the first to fourth global bit lines GBL0 to GBL3.

Also, based on the plurality of global bit line selection signals (for example, first to fourth global bit line selection signals) Sel_GBL0 to Sel_GBL3, the global decoder 134a may apply a non-selection voltage Vuns to the first to third global bit lines GBL0 to GBL2 and may apply a selection voltage Vsel to the fourth global bit line GBL3 connected to the fourth bit line BL3. To this end, the first to third global bit line selection signals Sel_GBL0 to Sel_GBL2 may have an off state (for example, a logic low level), and the fourth global bit line selection signals Sel_GBL3 may have an on state (for example, a logic high level).

Therefore, the non-selection voltage Vuns may be applied to the first to third bit lines BL0 to BL2 respectively connected to the first to third global bit lines GBL0 to GBL2, and the selection voltage Vsel may be applied to the fourth bit line BL3 connected to the fourth global bit line GBL3.

Also, the second bit line group BLG2 electrically disconnected by the transistors included in the second local decoder 132a may electrically be in a floating state. Based on the first bit line group selection signal Sel_BLG1, the first boundary transistor BT1 may electrically connect the first global bit line GBL0 to the fifth bit line BL4 and non-selection voltage Vuns may be applied to the fifth bit line BL4, disposed closest to the first bit line group BLG1, of the second bit line group BLG2.

When a peripheral bit line near a selected bit line is in a floating state, read disturb may occur due to a parasitic capacitance between the selected bit line and the peripheral bit line. According to an embodiment, the first boundary transistor BT1 may apply the non-selection voltage Vuns to bias an edge bit line (for example, BL4) adjacent to a selected bit line (for example, BL3) according to the first bit line group selection signal Sel_BLG1, thereby preventing read disturb.

In FIG. 9A, an example where four bit lines are included in one bit line group BLG1 or BLG2 is illustrated, but this is merely an embodiment and five or more bit lines or three or less bit lines (for example, 8, 16, 32, 64, or 128 bit lines) may be included in one bit line group.

Also, in FIG. 9A, an example where the first boundary transistor BT1 is connected to the first global bit line GBL0 is illustrated, but this is merely an embodiment and the first boundary transistor BT1 may be connected to the fourth bit line BL3 corresponding to an edge bit line or one of the first to third global bit lines GBL0 to GBL2, other than the fourth global bit lines GBL3 connected to the fifth bit line BL4 corresponding to an edge bit line adjacent to the first bit line group, of the second bit line group. Likewise, the second boundary transistor BT2 may be connected to one of the global bit lines GBL1 to GBL3 other than the first global bit line GBL0.

Referring to FIG. 9B, a plurality of transistors included in a first local decoder 131b may each be a P-type metal oxide semiconductor (PMOS) transistor. In this case, a first boundary transistor BT1 may be configured as a PMOS transistor. Also, when a plurality of transistors included in a second local decoder 132b are PMOS transistors, a second boundary transistor BT2 may be configured as a PMOS transistor.

Figure 10:
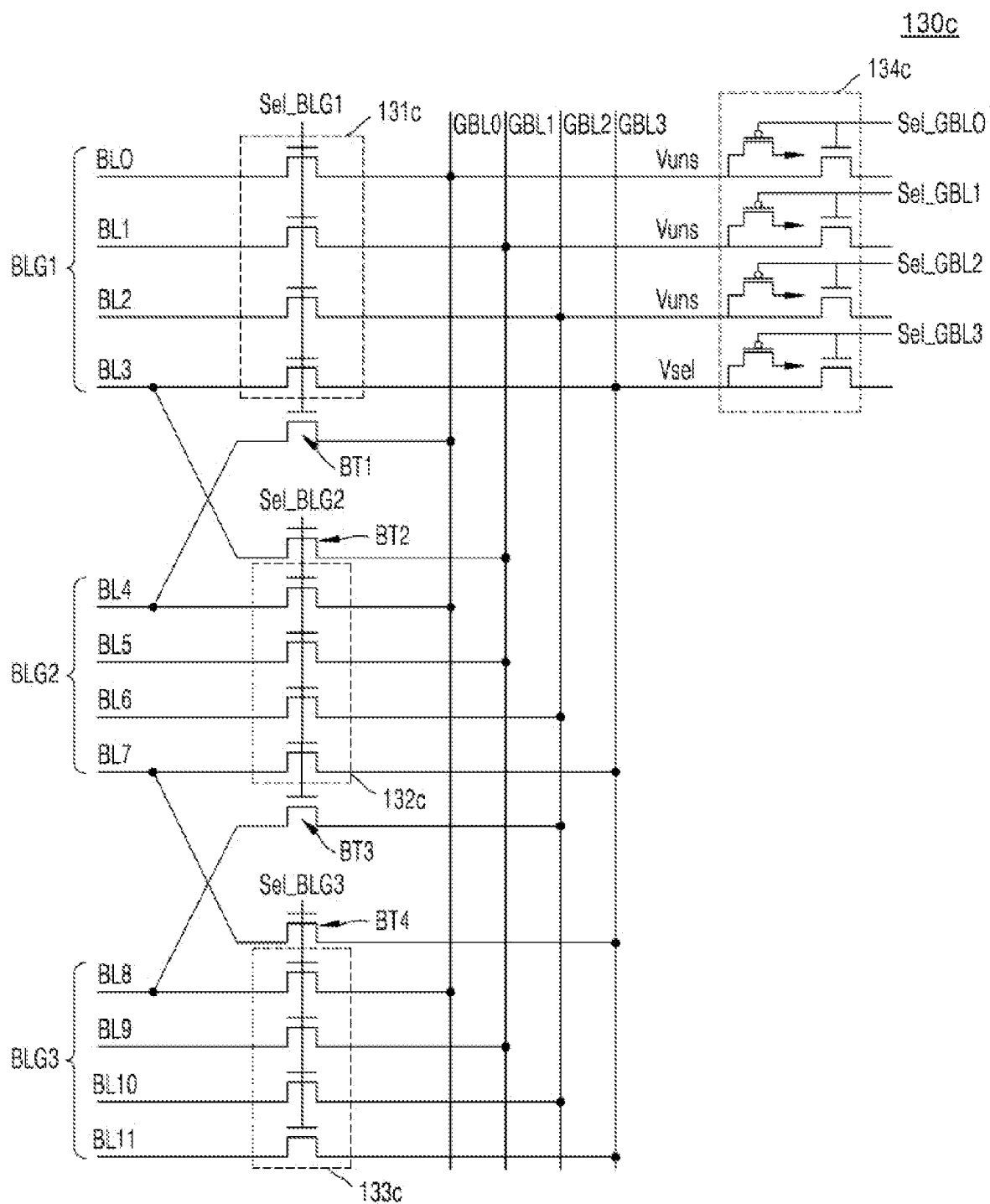
FIG. 10 is a circuit diagram illustrating a column decoder according to an embodiment.

A column decoder 130b of FIG. 9B may perform an operation which is the same as or similar to that of the column decoder 130a of FIG. 9A, but a control signal for various transistors included in the column decoder 130b of FIG. 9B may have a logic level opposite to that of the column decoder 130a of FIG. 9A. FIG. 10 is a circuit diagram illustrating a column decoder 130c according to an embodiment. In detail, FIG. 10 illustrates an embodiment where a plurality of boundary transistors BT1 to BT4 are connected to different global bit lines GBL0 to GBL3. Description which is the same as or similar to the description of FIG. 9A is omitted.

Referring to FIG. 10, the column decoder 130c may include a first local decoder 131c, a second local decoder 132c, a third local decoder 133c, a global decoder 134c, and a plurality of boundary transistors (for example, first to fourth boundary transistors) BT1 to BT4.

One end of the first boundary transistor BT1 may be connected to a fifth bit line BL4, disposed closest to a first bit line group BLG1, of a second bit line group BLG2, and the other end thereof may be connected to a first global bit line GBL0. The first boundary transistor BT1 may electrically connect or disconnect the fifth bit line BL4 to or from the first global bit line GBL0 according to a first bit line group selection signal Sel_BLG1.

One end of the second boundary transistor BT2 may be connected to a fourth bit line BL3, disposed closest to the second bit line group BLG2, of the first bit line group BLG1, and the other end thereof may be connected to a second global bit line GBL1. The second boundary transistor BT2 may electrically connect or disconnect the fourth bit line BL3 to or from the second global bit line GBL1 according to a second bit line group selection signal Sel_BLG2.

One end of the third boundary transistor BT3 may be connected to an eighth bit line BL7, disposed closest to a third bit line group BLG3, of the second bit line group BLG2, and the other end thereof may be connected to a third global bit line GBL2. The third boundary transistor BT3 may electrically connect or disconnect the eighth bit line BL7 to or from the third global bit line GBL2 according to the second bit line group selection signal Sel_BLG2.

One end of the fourth boundary transistor BT4 may be connected to a ninth bit line BL8, disposed closest to the second bit line group BLG2, of the third bit line group BLG3, and the other end thereof may be connected to a fourth global bit line GBL3. The fourth boundary transistor BT4 may electrically connect or disconnect the ninth bit line BL8 to or from the fourth global bit line GBL3 according to a third bit line group selection signal Sel_BLG3.

According to an embodiment, a plurality of boundary transistors BT1 to BT4 may be connected to different global bit lines GBL0 to GBL3. In an embodiment, odd-numbered boundary transistors (for example, the first boundary transistor BT1 and the third boundary transistor BT3) may be connected to odd-numbered global bit lines (for example, the first global bit line GBL0 and the third global bit line GBL2), and even-numbered boundary transistors (for example, the second boundary transistor BT2 and the fourth boundary transistor BT4) may be connected to even-numbered global bit lines (for example, the second global bit line GBL1 and the fourth global bit line GBL3).

Figure 11:
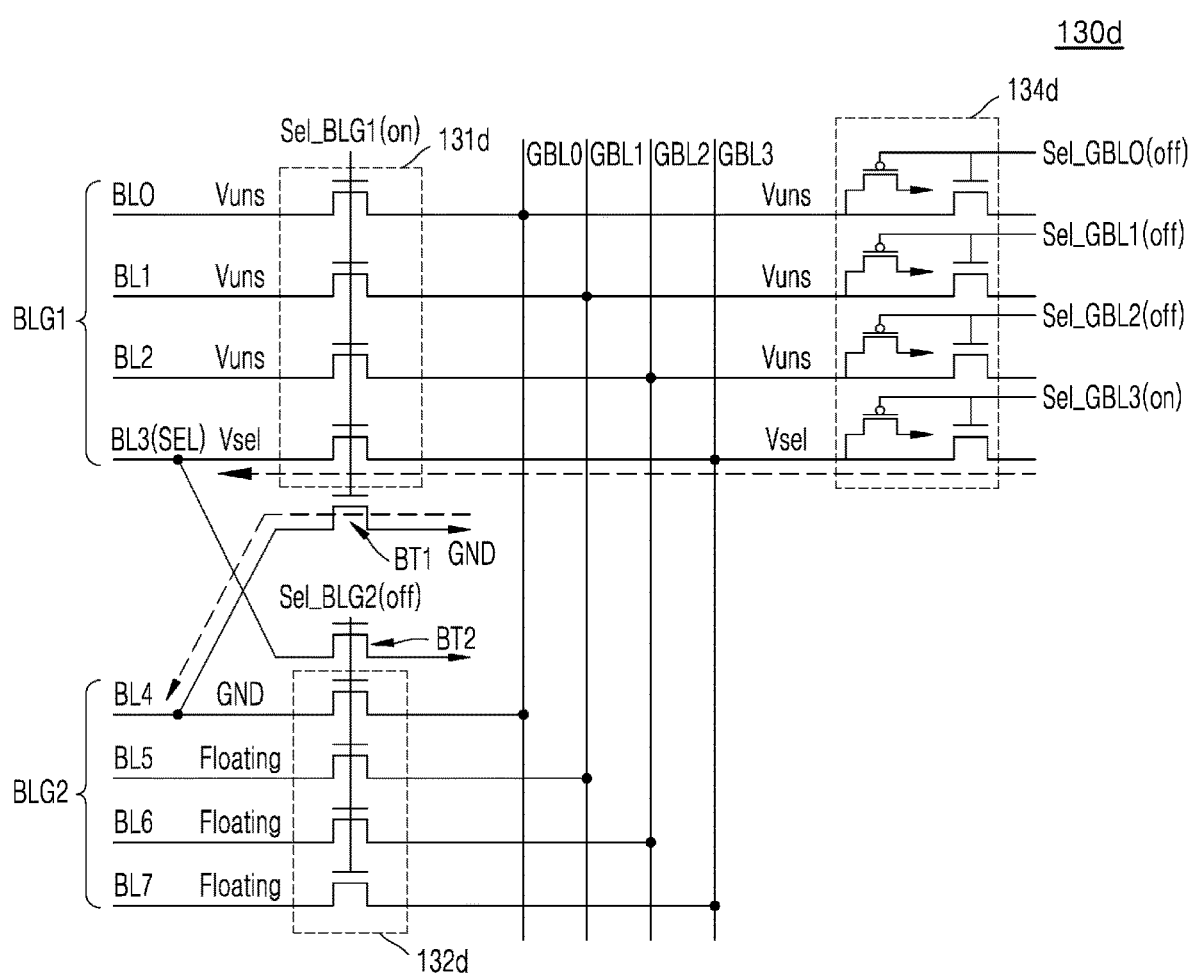
FIG. 11 is a circuit diagram illustrating a column decoder according to an embodiment.

FIG. 11 is a circuit diagram illustrating a column decoder 130d according to an embodiment. In detail, FIG. 11 illustrates an embodiment where the other ends of boundary transistors BT1 and BT2 are connected to a ground terminal. Description which is the same as or similar to the description of FIG. 9A is omitted.

Referring to FIG. 11, the column decoder 130d may include a first local decoder 131d, a second local decoder 132d, a global decoder 134d, and a plurality of boundary transistors (for example, first and second boundary transistors) BT1 and BT2. One end of the first boundary transistor BT1 may be connected to a fifth bit line BL4, and the other end thereof may be connected to a ground node. The first boundary transistor BT1 may apply a ground voltage GND to the fifth bit line BL4 according to a first bit line group selection signal Sel_BLG1. One end of the second boundary transistor BT2 may be connected to a fourth bit line BL3, and the other end thereof may be connected to the ground node. The second boundary transistor BT2 may apply the ground voltage GND to the fourth bit line BL3 according to a second bit line group selection signal Sel_BLG2.

According to an embodiment, the other ends of the first and second boundary transistors BT1 and BT2 may be connected to the ground node, and thus, the ground voltage GND may be applied to bias an edge bit line (for example, BL4) adjacent to a selected bit line (for example, BL3).

Figure 12:
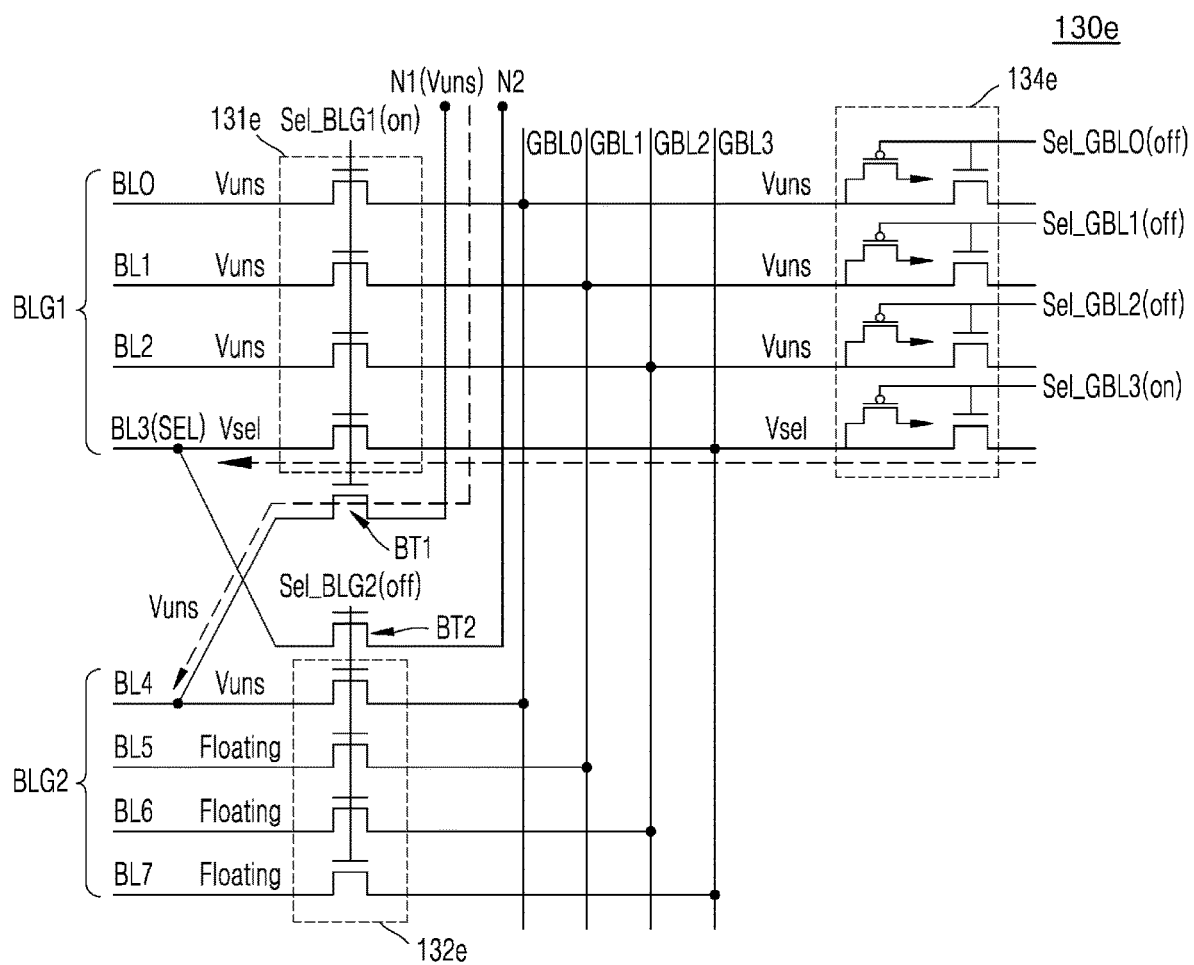
FIG. 12 is a circuit diagram illustrating a column decoder according to an embodiment.

FIG. 12 is a circuit diagram illustrating a column decoder 130e according to an embodiment. In detail, FIG. 12 illustrates an embodiment where the other ends of boundary transistors BT1 and BT2 are connected to a first node N1 or a second node N2. Description which is the same as or similar to the description of FIG. 9A is omitted.

Referring to FIG. 12, the column decoder 130e may include a first local decoder 131e, a second local decoder 132e, a global decoder 134e, and a plurality of boundary transistors (for example, first and second boundary transistors) BT1 and BT2. One end of the first boundary transistor BT1 may be connected to a fifth bit line BL4, and the other end thereof may be connected to the first node N1. The first boundary transistor BT1 may electrically connect or disconnect the fifth bit line BL4 to or from the first node N1 according to a first bit line group selection signal Sel_BLG1. One end of the second boundary transistor BT2 may be connected to a fourth bit line BL3, and the other end thereof may be connected to the second node N2. The second boundary transistor BT2 may electrically connect or disconnect the fourth bit line BL3 to or from the second node N2 according to a second bit line group selection signal Sel_BLG2.

In an embodiment, when a second bit line BL3 is selected, the first node N1 may be precharged with a non-selection voltage Vuns, and based on a first bit line group selection signal Sel_BLG1, the first boundary transistor BT1 may connect the first node N1 to the fifth bit line BL4 to apply the non-selection voltage Vuns to bias the fifth bit line BL4.

In an embodiment, the first node N1 and the second node N2 may have a voltage level of the non-selection voltage Vuns, and based on the first bit line group selection signal Sel_BLG1, the first boundary transistor BT1 may connect the first node N1 to the fifth bit line BL4 to apply the non-selection voltage Vuns to bias the fifth bit line BL4.

Figure 13:
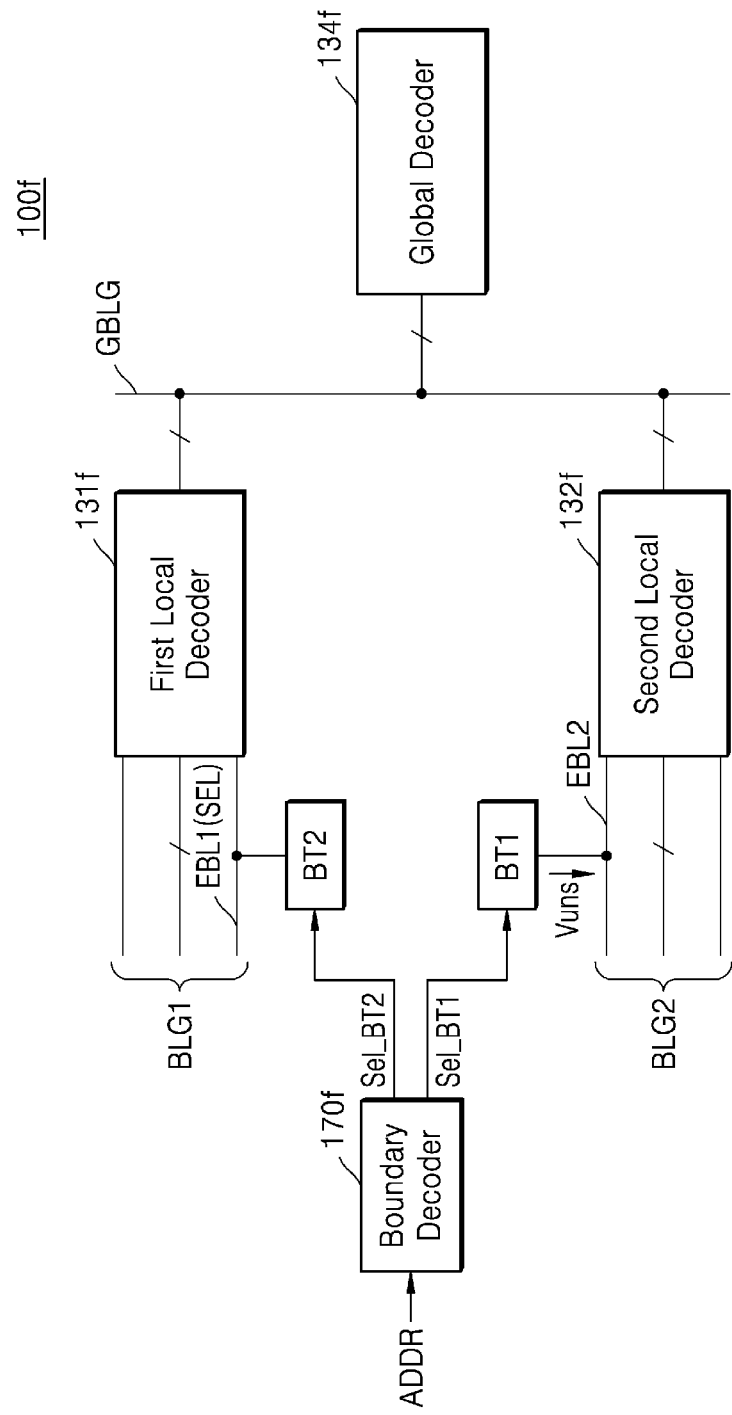
FIG. 13 is a block diagram illustrating a memory device according to an embodiment.

FIG. 13 is a block diagram illustrating a memory device 100f according to an embodiment. In detail, FIG. 13 illustrates an embodiment where each of a plurality of boundary transistors BT1 and BT2 receives boundary selection signals Sel_BT1 and Sel_BT2. Description which is the same as or similar to the description of FIG. 8 is omitted.

Referring to FIG. 13, the memory device 100f may include a first local decoder 131f, a second local decoder 132f, a global decoder 134f, a plurality of boundary transistors (for example, first and second boundary transistors) BT1 and BT2, and a boundary decoder 170f. The first local decoder 131f, the second local decoder 132f, and the global decoder 134f may be the same as or similar to the first local decoder 131, the second local decoder 132, and the global decoder 134 of FIG. 8, and thus, their detailed descriptions are omitted.

The boundary decoder 170f may receive an address ADDR, and based on the address ADDR, the boundary decoder 170f may output a first boundary selection signal Sel_BT1 to a first boundary transistor BT1 and may output a second boundary selection signal Sel_BT2 to a second boundary transistor BT2. In an embodiment, the boundary decoder 170f may be included in a control logic (140 of FIG. 2).

In an embodiment where a first edge bit line EBL1 included in a first bit line group BLG1 is selected, the boundary decoder 170f may output the first boundary selection signal Sel_BT1 in an on state (for example, a logic high level) and may output the second boundary selection signal Sel_BT2 in an off state (for example, a logic low level), based on the address ADDR.

The first boundary transistor BT1 may apply a non-selection voltage Vuns to bias a second edge bit line BL2, disposed closest to a first bit line group BLG1, of a second bit line group BLG2 according to the on state of the first boundary selection signal Sel_BT1.

In FIG. 13, an example where the boundary decoder 170f receives the address ADDR is illustrated, but in other embodiments, the boundary decoder 170f may receive a column address (X_ADDR of FIG. 2) from a control logic (140 of FIG. 2) and may generate the first and second boundary selection signals Sel_BT1 and Sel_BT2 according to the column address X_ADDR.

Figure 14:
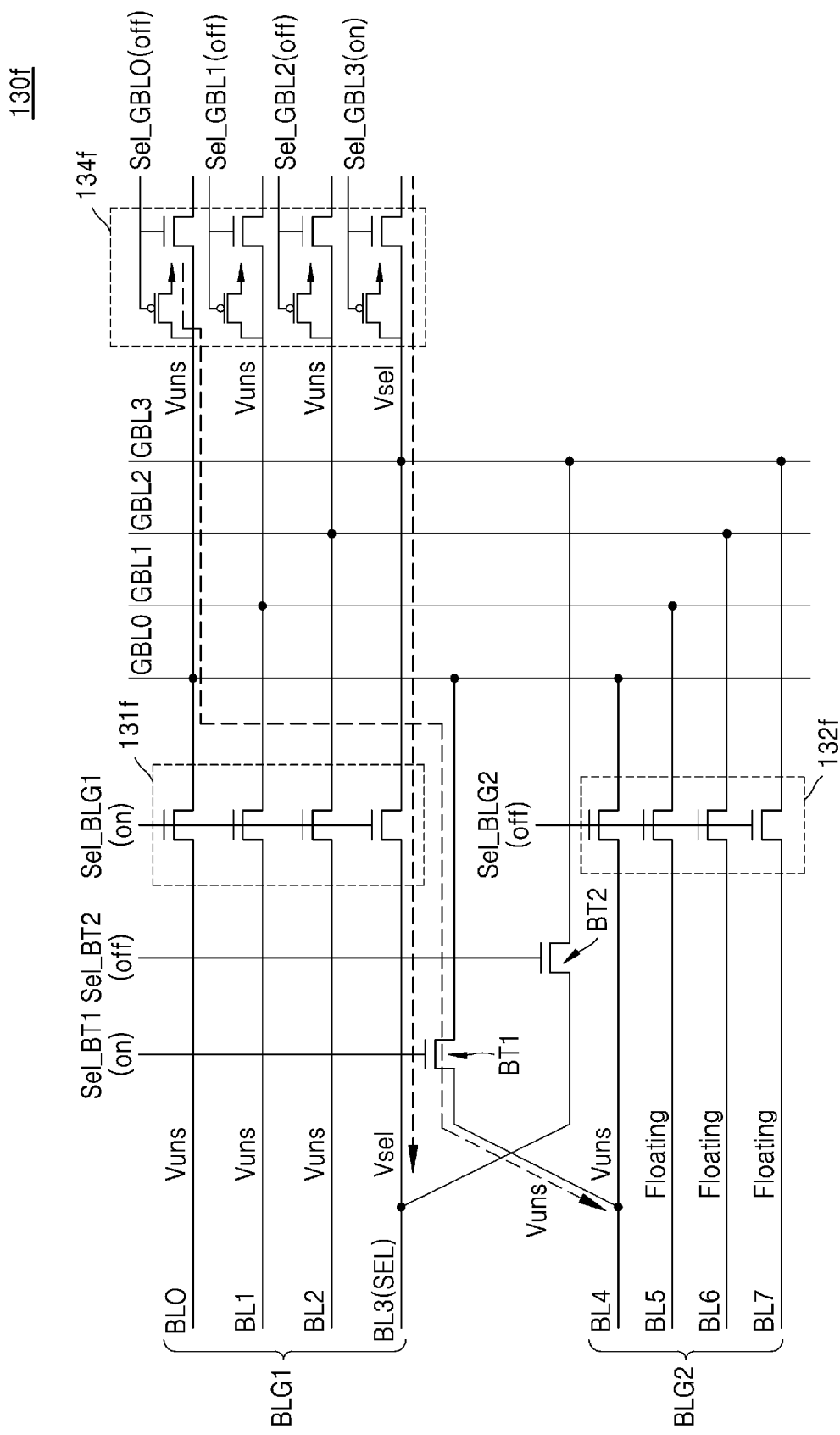
FIG. 14 is a circuit diagram illustrating a column decoder according to an embodiment.

FIG. 14 is a circuit diagram illustrating a column decoder 130f according to an embodiment. In detail, FIG. 14 illustrates an embodiment where a plurality of boundary transistors BT1 and BT2 operate based on boundary selection signals Sel_BT1 and Sel_BT2. Description which is the same as or similar to the description of FIG. 9A is omitted.

Referring to FIGS. 13 and 14, the column decoder 130f may include a first local decoder 131f, a second local decoder 132f, a global decoder 134f, and a plurality of boundary transistors (for example, first and second boundary transistors) BT1 and BT2. One end of the first boundary transistor BT1 may be connected to a fifth bit line BL4, and the other end thereof may be connected to a first global bit line GBL0. The first boundary transistor BT1 may electrically connect or disconnect the fifth bit line BL4 to or from the first global bit line GBL0 according to a first boundary selection signal Sel_BT1 received independently from a first bit line group selection signal Sel_BLG1.

One end of the second boundary transistor BT2 may be connected to a fourth bit line BL3, and the other end thereof may be connected to a fourth global bit line GBL3. The second boundary transistor BT2 may electrically connect or disconnect the fourth bit line BL3 to or from the fourth global bit line GBL3 according to a second boundary selection signal Sel_BT2 received independently from a second bit line group selection signal Sel_BLG2.

Figure 15:
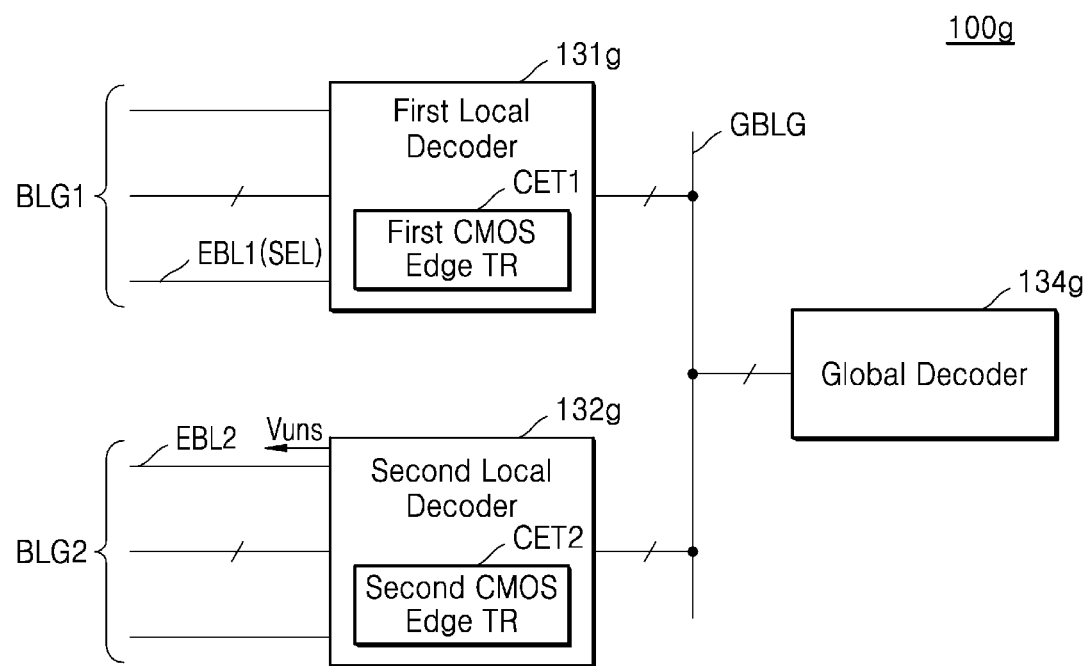
FIG. 15 is a block diagram illustrating a memory device according to an embodiment.

FIG. 15 is a block diagram illustrating a memory device 100g according to an embodiment. In detail, FIG. 15 illustrates an embodiment where each of a plurality of local decoders, for example, first and second local decoders 131g and 132g, includes a CMOS edge transistor. Description which is the same as or similar to the description of FIG. 8 is omitted.

Referring to FIG. 15, the memory device 100g may include the first local decoder 131g, the second local decoder 132g, and a global decoder 134g. The global decoder 134g may be the same as or similar to the global decoder 134 of FIG. 8, and thus, its detailed description is omitted.

The first local decoder 131g may include a first CMOS edge transistor CET1, and the second local decoder 132g may include a second CMOS edge transistor CET2. The first CMOS edge transistor CET1 may be connected to a first edge bit line EBL1, and the second CMOS edge transistor CET2 may be connected to a second edge bit line EBL2.

When a first bit line group BLG1 is not selected, the first CMOS edge transistor CET1 may apply a non-selection voltage Vuns to the first edge bit line EBL1, and when a second bit line group BLG2 is not selected, the second CMOS edge transistor CET2 may apply the non-selection voltage Vuns to the second edge bit line EBL2. In an embodiment where the first edge bit line EBL1 is selected, the second CMOS edge transistor CET2 may apply the non-selection voltage Vuns to the second edge bit line EBL2.

Figure 16:
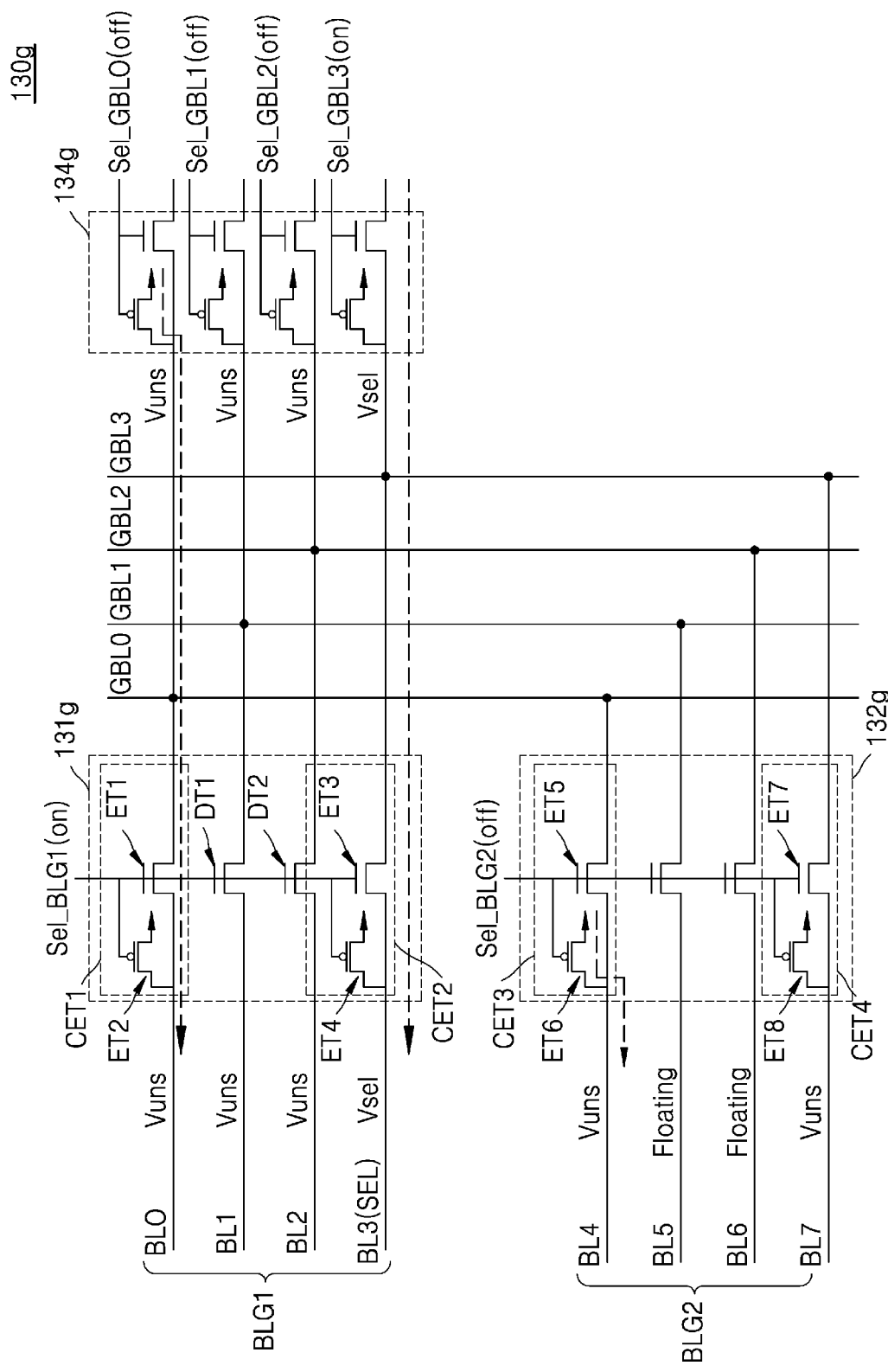
FIG. 16 is a circuit diagram illustrating a column decoder according to an embodiment.

FIG. 16 is a circuit diagram illustrating a column decoder 130g according to an embodiment. In detail, FIG. 16 illustrates a column decoder 130g including a CMOS edge transistor. Descriptions which are the same as or similar to the descriptions of FIGS. 9A and 15 are omitted here to avoid redundancy.

Referring to FIG. 16, the column decoder 130g may include a first local decoder 131g, a second local decoder 132g, and a global decoder 134g. The global decoder 134g may be the same as or similar to the global decoder 134a of FIG. 9A, and thus, its detailed description is omitted.

The first local decoder 131g may include a first edge transistor ET1, a second edge transistor ET2, a first decoding transistor DT1, a second decoding transistor DT2, a third edge transistor ET3, and a fourth edge transistor ET4. The first edge transistor ET1 and the second edge transistor ET2 may configure a first CMOS edge transistor CET1, and the third edge transistor ET3 and the fourth edge transistor ET4 may configure a second CMOS edge transistor CET2.

The first CMOS edge transistor CET1 may connect a first bit line BL0 to one of a first global bit line GBL0 and a ground node according to a first bit line group selection signal Sel_BLG1, and the second CMOS edge transistor CET2 may connect a fourth bit line BL3 to one of a fourth global bit line GBL3 and the ground node according to the first bit line group selection signal Sel_BLG1.

The second local decoder 132g may include a fifth edge transistor ET5, a sixth edge transistor ET6, a seventh edge transistor ET7, and an eighth edge transistor ET8. The fifth edge transistor ET5 and the sixth edge transistor ET6 may configure a third CMOS edge transistor CET3, and the seventh edge transistor ET7 and the eighth edge transistor ET8 may configure a fourth CMOS edge transistor CET4.

The third CMOS edge transistor CET3 may connect a fifth bit line BL4 to one of the first global bit line GBL0 and the ground node according to a second bit line group selection signal Sel_BLG2, and the fourth CMOS edge transistor CET4 may connect an eighth bit line BL7 to one of the fourth global bit line GBL3 and the ground node according to the second bit line group selection signal Sel_BLG2.

In an embodiment where the fourth bit line BL3 is selected, as the first bit line group selection signal Sel_BLG1 is in an on state (for example, a logic high level), the first CMOS edge transistor CET1 may connect the first bit line BL0 to the first global bit line GBL0, and a non-selection voltage Vuns (for example, a ground voltage) may be applied to the first global bit line GBL0 by the global decoder 134g, whereby the non-selection voltage Vuns may be applied to the first bit line BL0. As the first bit line group selection signal Sel_BLG1 is in an on state (for example, a logic high level), the second CMOS edge transistor CET2 may connect the fourth bit line BL3 to the fourth global bit line GBL3, and a selection voltage Vsel may be applied to the fourth global bit line GBL3 by the global decoder 134g, whereby the selection voltage Vsel may be applied to the fourth bit line BL3.

Also, as the second bit line group selection signal Sel_BLG2 is in an off state (for example, a logic low level), the third CMOS edge transistor CET3 may connect the fifth bit line BL4 to the ground node, and the non-selection voltage Vuns may be applied to the fifth bit line BL4. As the second bit line group selection signal Sel_BLG2 is in an off state (for example, a logic low level), the fourth CMOS edge transistor CET4 may connect the eighth bit line BL7 to the ground node, and the non-selection voltage Vuns may be applied to the eighth bit line BL7.

According to an embodiment, the first and second local decoders 131g and 132g may each include a CMOS edge transistor, and when a bit line group is not selected, the CMOS edge transistor may bias an edge bit line to a non-selection voltage, thereby preventing read/write disturb.

In FIG. 16, an example where a CMOS edge transistor includes a PMOS transistor connected to a ground node and an NMOS transistor connected to a global bit line is illustrated. However, this is merely an example and the inventive concept may be applied to an embodiment where a CMOS edge transistor includes a PMOS transistor connected to a ground node or a non-selection voltage source node and an NMOS transistor connected to a global bit line.

Figure 17A:
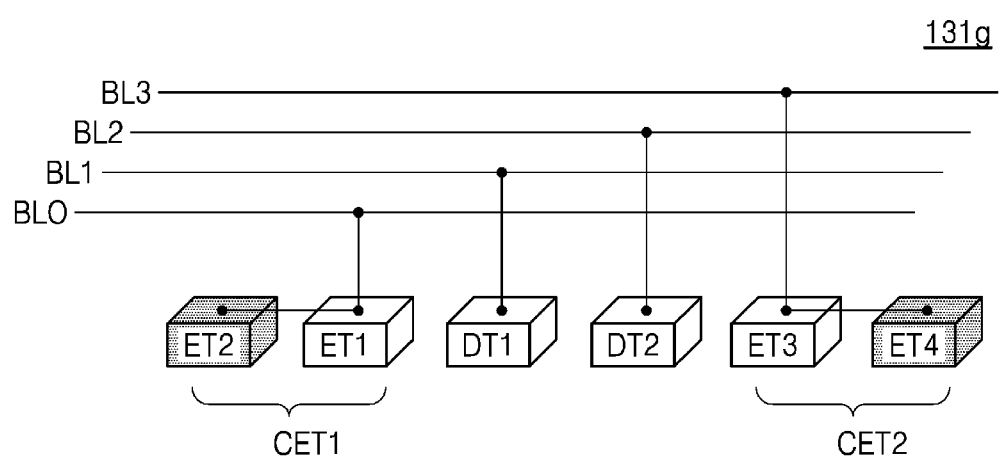
FIGS. 17A and 17B are diagrams for reference in describing a local decoder according to an embodiment.
Figure 17B:
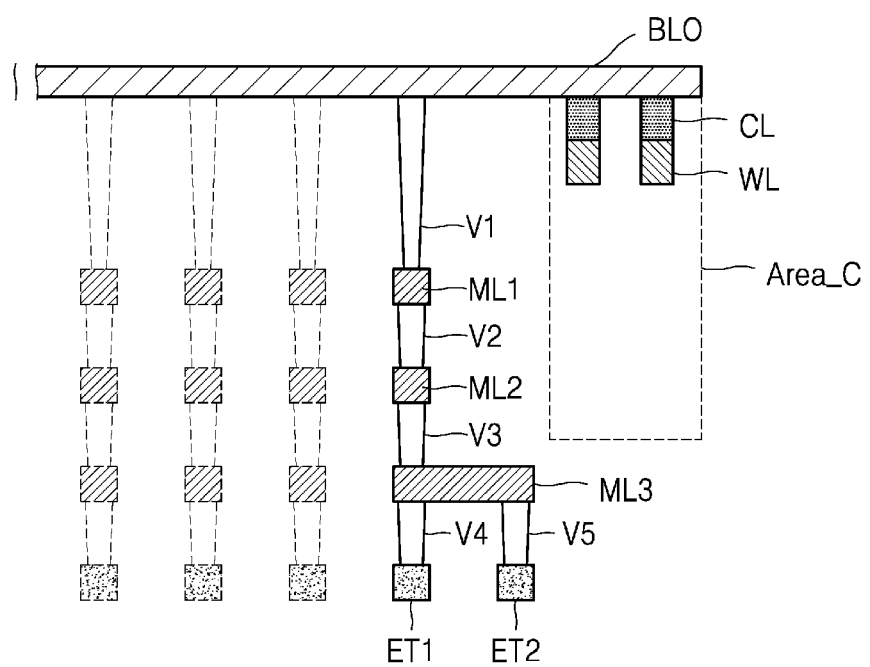

FIGS. 17A and 17B are diagrams for reference in describing a local decoder according to an embodiment. In particular, FIGS. 17A and 17B are for reference in describing an example of the first local decoder 131g of FIG. 16.

Referring to FIG. 17A, a first local decoder 131g according to an embodiment may include a first edge transistor ET1, a second edge transistor ET2, a first decoding transistor DT1, a second decoding transistor DT2, a third edge transistor ET3, and a fourth edge transistor ET4. A gate of the first edge transistor ET1 and a gate of the second edge transistor ET2 may be connected to a common node for configuring a first CMOS edge transistor CET1 connected to bit line BL0, and a gate of the third edge transistor ET3 and a gate of the fourth edge transistor ET4 may be connected to another common node for configuring a second CMOS edge transistor CET2 connected to bit line BL3. In this example, the first decoding transistor DT1 is gated to a bit line BL1 and the second decoding transistor DT2 is gated to bit line BL2.

Referring to FIG. 17B, an active area of the first edge transistor ET1 may be connected to the first bit line BL0 through a first via V1, a first metal layer ML1, a second via V2, a second metal layer ML2, a third via V3, a third metal layer ML3, and a fourth via V4. According to an embodiment, an active area of the second edge transistor ET2 may share the first via V1, the first metal layer ML1, the second via V2, the second metal layer ML2, and the third via V3 with the first edge transistor ET1 and may be connected to the first bit line BL0 by individually using the third metal layer ML3 and the fourth via V4. Therefore, the second edge transistor ET2 may be disposed below a cell area Area_C where a cell CL and a word line WL are disposed.

Figure 18:
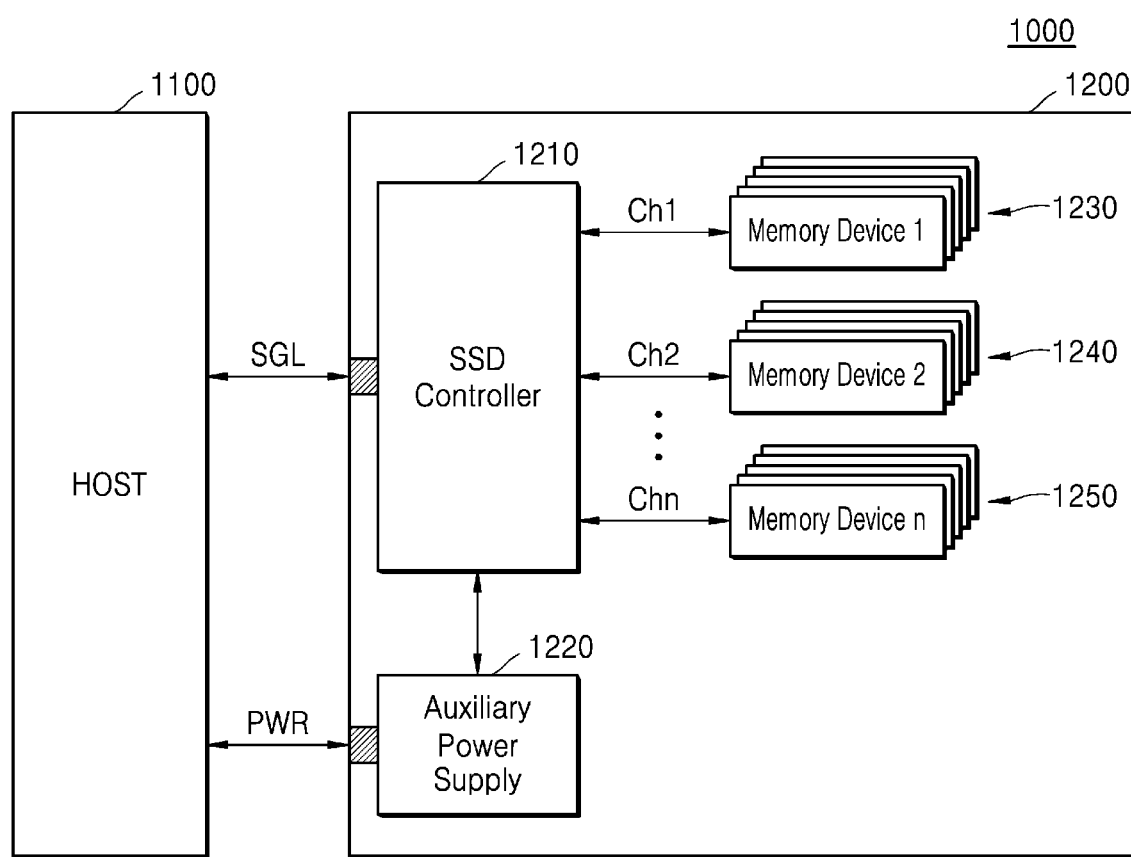
FIG. 18 is a block diagram illustrating an example in which a memory device according to an embodiment is applied to a solid state drive (SSD) system.

FIG. 18 is a block diagram illustrating an example where a memory device according to an embodiment is applied to a solid state drive (SSD) system.

Referring to FIG. 18, an SSD system 1000 according to an embodiment may include a host 1100 and an SSD 1200. The SSD 1200 may transmit and receive signals (SGL) to and from the host 1100 through a signal connector and may be supplied with power (PWR) through a power connector. The SSD 1200 may include an SSD controller 1210, an auxiliary power supply 1220, and a plurality of non-volatile memory devices 1230, 1240, and 1250. At least one of the plurality of non-volatile memory devices 1230, 1240, and 1250 may be a resistive memory device in accordance with one or more embodiments described above.

The SSD controller 1210 may be connected to the plurality of non-volatile memory devices 1230, 1240, and 1250 through a plurality of channels Ch1 to Chn and may store data in the plurality of non-volatile memory devices 1230, 1240, and 1250 or may read data from the plurality of non-volatile memory devices 1230, 1240, and 1250.

While the inventive concepts have been particularly shown and described with reference to embodiments thereof, it will be understood that various changes in form and details may be made therein without departing from the spirit and scope of the following claims.

What is claimed is:

1. A resistive memory device comprising:
a first bit line group including a first plurality of bit lines;
a first bit line group selection line;
a first edge bit line disposed at an outermost position in the first bit line group;
a first middle bit line included in the first bit line group, the first middle bit line being adjacent to the first edge bit line; and
a second bit line group adjacent the first bit line group and including a second plurality of bit lines; and
a second bit line group selection line that is separate from the first bit line group selection line,
wherein the first edge bit line is connected to a first global bit line through a first edge transistor,
the first middle bit line is connected to a second global bit line through a first decoding transistor,
the first edge bit line is further connected to a node through a first boundary transistor, the node supplying a non-selection voltage;
a gate of the first edge transistor and a gate of the first decoding transistor are connected to the first bit line group selection line, and
a gate of the first boundary transistor is connected to the second bit line group selection line.

2. The resistive memory device of claim 1, wherein a second middle bit line included in the first bit line group is connected to a third global bit line through a second decoding transistor, and
a gate of the second decoding transistor is connected to the first bit line group selection line.

3. The resistive memory device of claim 2, wherein the first edge transistor, the first decoding transistor, and the second decoding transistor are the same transistor type and are the same size.

4. The resistive memory device of claim 3, wherein the first edge transistor, the first decoding transistor, and the second decoding transistor are NMOS transistors.

5. The resistive memory device of claim 4, wherein the first, second and third global bit lines are three of a plurality of global bit lines, and all the bit lines included in the first bit line group are respectively connected to different ones of the plurality of global bit lines,
the first edge transistor and the first and second decoding transistors are three of a plurality of transistors connecting all the bit lines of the first bit line group to different ones of the plurality of global bit lines, and
gates of the plurality of transistors are all connected to the first bit line group selection line.

6. The resistive memory device of claim 5, wherein the first global bit line is adjacent to the second global bit line.

7. The resistive memory device of claim 6, wherein the first middle bit line is not connected to the node.

8. The resistive memory device of claim 7, further comprising:
a second edge bit line included in the second bit line group, the second edge bit line being adjacent to the first bit line group;
a fourth global bit line connected to the second edge bit line through a second edge transistor; and
a third middle bit line included in the second bit line group, connected to the third global bit line through a third decoding transistor and adjacent to the second edge bit line,
wherein the first boundary transistor differs from the first edge transistor, and
a gate of the second edge transistor and a gate of the third decoding transistor are connected to the second bit line group selection line.

9. The resistive memory device of claim 7, further comprising:
a second edge bit line included in the second bit line group, the second edge bit line being adjacent to the first bit line group;
a fourth global bit line connected to the second edge bit line through a second edge transistor; and
a third middle bit line included in the second bit line group, connected to the third global bit line through a third decoding transistor and adjacent to the second edge bit line,
wherein the first boundary transistor differs from the first edge transistor.

10. The resistive memory device of claim 2,
wherein a second edge bit line included in the second bit line group is adjacent to the first bit line group and is connected to a fourth global bit line through a second edge transistor; and
the resistive memory device further comprises a third bit line group including a plurality of bit lines and differing from the second bit line group, the third bit line group being adjacent to the second bit line group,
wherein a third edge bit line included in the third bit line group is adjacent to the second bit line group,
the third edge bit line is connected to the fourth global bit line through a third edge transistor, and
the third edge bit line is connected to the second global bit line through a third boundary transistor.

* * * * *